United States Patent
Aratani et al.

(10) Patent No.: US 9,564,583 B2
(45) Date of Patent: Feb. 7, 2017

(54) MEMORY DEVICE COMPRISING A NON-PHASE-CHANGING AMORPHOUS CHALCOGENIDE MEMORY LAYER AND A METAL CHALCOGENIDE ION-SOURCE LAYER

(75) Inventors: Katsuhisa Aratani, Chiba (JP); Akira Kouchiyama, Kanagawa (JP); Minoru Ishida, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 10/514,009

(22) PCT Filed: Mar. 18, 2004

(86) PCT No.: PCT/JP2004/003686
§ 371 (c)(1),
(2), (4) Date: Nov. 8, 2004

(87) PCT Pub. No.: WO2004/084306
PCT Pub. Date: Sep. 30, 2004

(65) Prior Publication Data
US 2005/0226062 A1 Oct. 13, 2005

(30) Foreign Application Priority Data

Mar. 20, 2003 (JP) ................ P2003-078447
May 15, 2003 (JP) ................ P2003-137651

(51) Int. Cl.
*H01L 45/00* (2006.01)
(52) U.S. Cl.
CPC ......... *H01L 45/085* (2013.01); *H01L 45/1233* (2013.01); *H01L 45/1266* (2013.01); *H01L 45/144* (2013.01); *H01L 45/145* (2013.01); *H01L 45/146* (2013.01); *H01L 45/1625* (2013.01)

(58) Field of Classification Search
CPC ............... H01L 45/085; H01L 45/1233; H01L 45/1266; H01L 45/144
USPC ............................ 257/2, 55, 63, 4, E45.002
See application file for complete search history.

(56) References Cited

U.S. PATENT DOCUMENTS 3,883,887 A * 5/1975 Robinson, Sr. .................. 345/80
3,886,577 A * 5/1975 Buckley .............................. 257/3
4,115,872 A * 9/1978 Bluhm .......................... 365/163
(Continued)

FOREIGN PATENT DOCUMENTS

FR    2381396    * 10/1978
GB    2 007 021 A    * 5/1979
(Continued)

OTHER PUBLICATIONS

Kawasaki, M., et al., "Ionic conductivity of Agx(GeSe3)1-x (0 <=x<=0.571) glasses",1999,Elsvier Sci., Solid State Ionics, No. 123, 259-269.*

*Primary Examiner* — Marcos D Pizarro
(74) *Attorney, Agent, or Firm* — Dentons US LLP

(57) ABSTRACT

A memory element includes an amorphous thin-film that is between a first electrode and a second electrode in which at least one of the first electrode and the second electrode contains Ag or Cu. The amorphous thin film is a non-phase changing, amorphous material. A storage device includes a plurality of memory elements. Each memory element includes a wiring connected to a side of the first electrode and a wiring connected to a side of the second electrode.

9 Claims, 12 Drawing Sheets

(56) References Cited

U.S. PATENT DOCUMENTS

| | | | | |
|---|---|---|---|---|
| 4,177,475 A | * | 12/1979 | Holmberg | 257/2 |
| 4,433,342 A | * | 2/1984 | Patel et al. | 257/2 |
| 4,969,141 A | * | 11/1990 | Takaoka et al. | 369/100 |
| 5,181,096 A | * | 1/1993 | Forouhi | 257/530 |
| 5,585,300 A | * | 12/1996 | Summerfelt | 505/330 |
| 5,740,192 A | * | 4/1998 | Hatano et al. | 372/45.01 |
| 5,825,046 A | * | 10/1998 | Czubatyj et al. | 257/2 |
| 5,920,788 A | * | 7/1999 | Reinberg | 438/466 |
| 6,084,796 A | | 7/2000 | Kozicki et al. | |
| 6,487,106 B1 | | 11/2002 | Kozicki | |
| 6,825,489 B2 | * | 11/2004 | Kozicki | 257/42 |
| 6,849,868 B2 | * | 2/2005 | Campbell | 257/35 |
| 6,864,500 B2 | * | 3/2005 | Gilton | 257/2 |
| 6,888,155 B2 | * | 5/2005 | Campbell | 257/2 |
| 6,954,941 B2 | * | 10/2005 | Miyamoto et al. | 720/718 |
| 7,687,793 B2 | * | 3/2010 | Harshfield et al. | 257/2 |

FOREIGN PATENT DOCUMENTS

| | | |
|---|---|---|
| JP | 06-28841 | 2/1994 |
| JP | 2000-512058 | 9/2000 |
| JP | 2002-536840 | 10/2002 |
| JP | 2004-96014 | 3/2004 |

* cited by examiner

MEMORY DEVICE COMPRISING A NON-PHASE-CHANGING AMORPHOUS CHALCOGENIDE MEMORY LAYER AND A METAL CHALCOGENIDE ION-SOURCE LAYER

The present invention relates to a memory element in which information is recorded and a storage device using the memory element.

In information equipment such as a computer, DRAM of high speed operation and high density is widely used as a random access memory.

However, a production cost of DRAM is high in comparison with a conventional logic circuit LSI and signal processor that are used for electric equipment, because the manufacturing process is complicated.

Also, DRAM is a volatile memory that information disappears when the power supply is cut off, and needs a refresh operation frequently, namely an operation that the read-in information is read out and is amplified again and is read again.

Therefore, FeRAM (Ferroelectric Random Access Memory) and MRAM (Magnetic Random Access memory) and others are proposed for example, as a non-volatile memory that information does not disappear when the power supply is cut off.

In the case of these memories, the read-in information can be preserved for a long period of time without supplying power.

Also, in the case of these memories, the refresh operation is made unnecessary due to the non-volatile memory, and it is assumed that the power consumption can be decreased to the extent.

However, regarding the above-mentioned non-volatile memory it becomes difficult to secure the characteristics as the memory element in accordance with miniaturization of a memory element that composes each memory cell.

Therefore, it is difficult to make an element reduce to a limit of the design rule and a limit in manufacture process.

Accordingly, a new type of memory element is proposed as the memory of the construction which is suitable for the reduction.

This memory element has a structure in which an ionic conductor that contains a certain metal is held between two electrodes.

Further, by either one of two electrodes is made to contain the metal which is contained in the ionic conductor, the metal contained in the electrode diffuses into the ionic conductor as an ion in the case of applying a voltage between the two electrodes, so that the electrical characteristics such as the resistance or capacitance of the ion conductor changes.

It is possible that a storage device is constructed by using this characteristic, (For example, refer to the following Patent document 1 and the following Non-Patent document 1).

Specifically, an ionic conductor, which consists of an solid solution of a chalcogenide- and a metal, and more specifically, which consists of the material that Ag, Cu or Zn is dissolved with AsS, GeS or GeSe, and either one of two electrodes contains Ag, Cu or Zn (refer to the following Patent document 1).

Further, as a manufacturing method of this memory element, the method is proposed, in which an ionic conductor composed of a chalcogenide is accumulated on a substrate, then, an electrode which contains a metal is accumulated on the ionic conductor, and then, by irradiating light which has the energy more than the optical gap of an ionic conductor or by applying the heat thereto to diffuse the metal in the ionic conductor, an ionic conductor which contains a metal is formed.

Furthermore, various non-volatile memories for which a crystalline oxide material is used are proposed, and for example, in a device having a construction in which a Cr-doped $SrZrO_3$ crystalline material is held between a lower electrode of $SrRuO_3$ or Pt and a upper electrode of Au or Pt, a memory that the resistance is changing reversibly by applying a voltage with different polarity is reported (refer to the following Non-Patent document 2).

However, the details such as a principle are not clarified.
Patent literature 1: Japanese Translation of PCT International Patent Application No 2002-536840
Non-Patent document 1: Nikkei Electronics, No. 2003.1.20, on page 104
Non-Patent document 2: A. Beck. et. al, Appl. Phys. Lett., 77, (2000), p 139

However, in the memory element of above-mentioned construction, an ionic conductor is composed of a solid solution of a chalcogenide and a metal, and a metal, namely Au, Cu or Zn, for example, is dissolved in advance, so that the electric-current required for recording by the diffusion of the metal ion is more needed.

Also, the amount of change of the resistance value before and after recording is comparatively small.

Therefore, when the recorded information is read, it becomes difficult to distinguish the contents of the information.

Further, using the manufacturing method in which a metal is made diffuse into an ionic conductor and is dissolved by irradiating light which has more energy than the optical gap of the ionic conductor or by applying the heat makes the manufacturing process complicated.

Also, the above-mentioned memory element, which has the structure that Ag or Cu is contained in either one of an upper electrode or a lower electrode, and Ge—S or Ge—Se amorphous chalcogenide material is held between those electrodes, has a problem that a crystallization is caused in a chalcogenide thin-film due to temperature rising, the characteristics of the material changes in accordance with the crystallization, and a portion which originally holds data under the condition of the high resistance changes into the condition of the low resistance at the time of the high temperature environment or at the time of the long-term preservation, and others.

When a crystal material is used for the recording material between the upper electrode and the lower electrode, there are a number of problems in comparison with the use of an amorphous material, and it is difficult to perform mass-production with the low price.

First, for the crystal growth, the foundation material is limited, and for example the necessity to use single crystal material arises.

Also, for example a high temperature treatment of 700 degrees centigrade must be performed to obtain an excellent crystalline quality.

Furthermore, the coating thickness of 50 nm or more for example is necessary to obtain the high performance of the crystal, and the problem of the minute processing with respect to the size of less than 50 nm for example arises from a viewpoint of the aspect ratio in the time of the minute processing.

Moreover, since the added material for the characteristics improvement requires not to cause such problems as miss-matching of the lattice constant and others, the element is limited to a specific element group, so that it is difficult to obtain the required characteristics.

In order to solve the above-mentioned problems, the present invention provides a memory element, in which information can be read and written easily and which can be produced easily by means of a comparatively simple manufacturing method, and a storage device using this memory element.

Further, the present invention provides a memory element, in which information can be read and written easily and in which recoded contents can be held stably in the high temperature environment or at the time of the long-term preservation, and which can be produced easily by means of the comparatively simple manufacturing method; and a storage device using this memory element.

SUMMARY OF THE INVENTION

A memory element according to the present invention has an amorphous thin-film that is in between the first electrode and the second electrode, wherein at least one electrode in the first electrode and the second electrode contains Ag or Cu and the amorphous thin-film is composed of Ge and at least one element selected from, S, Se, Te and Sb.

A storage device according to the present invention includes: a memory element which has an amorphous thin-film that is in between the first electrode and the second electrode, in which at least one electrode in the first electrode and the second electrode contains Ag or Cu and the amorphous thin-film is composed of Ge and at least one element selected from, S, Se, Te and Sb, a wiring connected to the side of the first electrode and a wiring connected to the side of the second electrode, wherein the memory element is arranged in large numbers.

According to the construction of a memory element of the above-mentioned present invention, since an amorphous thin-film is in between the first electrode and the second electrode, at least one electrode in the first electrode and the second electrode contains Ag or Cu and the amorphous thin-film is composed of Ge and at least one element selected from, S, Se, Te and Sb, information is memorized using the diffusion of Ag or Cu contained in the electrode into the amorphous thin-film as an ion.

Specifically, when a positive voltage is applied to one of the electrodes which contains Ag or Cu and then a positive voltage is applied to an element, Ag or Cu contained in the electrode diffuses into the amorphous thin-film as an ion and is combined with the electron in a portion of the other electrode inside the amorphous thin-film to be separated out, so that the resistance of the amorphous thin-film becomes low and also the resistance of the element becomes low, and as a result information can be memorized. Further, in this condition, when a negative voltage is applied to one of the electrodes which contains Ag or Cu and a negative voltage is applied to the element, Ag or Cu separated out in the other electrode side is ionized and goes back to one of the electrodes, so that the resistance of the amorphous thin-film goes back to the original high state and also the resistance of the element becomes high, and as a result the recoded information can be erased.

Further, by constructing the amorphous thin-film before recording not to include Ag or Cu which becomes an ion, an electric-current required in the recording can be made small, and a change of the resistance can be enlarged. Further, the time required for the recording can also be shortened.

According to the construction of a storage device of the above-mentioned present invention, since a memory element of the above-mentioned present invention, a wiring connected to the side of the first electrode and a wiring connected to the sides of the second electrode are included and the memory element is arranged in large numbers, recording and erasing of information can be performed with electric-current flowing through the wirings into the memory elements.

Another memory element according to the present invention has an amorphous thin-film that is in between the first electrode and the second electrode, wherein at least one electrode in the first electrode and the second electrode contains Ag or Cu, and the amorphous thin-film is formed of an oxide.

Another storage device according to the present invention includes: a memory element which has an amorphous thin-film that is in between the first electrode and the second electrode, at least one electrode in the first electrode and the second electrode contains Ag or Cu and an amorphous thin-film is formed of an oxide, a wiring connected to the side of the first electrode and a wiring connected to the sides of the second electrode, wherein a memory element is arranged in large numbers.

According to the construction of another memory element of the above-mentioned present invention, since an amorphous thin-film that is held in between the first electrode and the second electrode, at least one electrode in the first electrode and the second electrode contains Ag or Cu and an amorphous thin-film is formed of an oxide, information is memorized using the diffusion of Ag or Cu contained in the electrode into the amorphous thin-film as an ion similarly to the above described construction of a memory element of the present invention.

According to the construction of another storage device of the above-mentioned present invention, since another memory element of the above-mentioned present invention, a wiring connected to the side of the first electrode and a wiring connected to the sides of the second electrode are included and a memory element is arranged in large numbers, recording and erasing of information can be performed with electric-current flowing through the wirings into the memory elements.

According to the above-mentioned present invention, the electric-current required in recording to a memory element can be reduced, and also a change of the resistance of a memory element before and after the recording can be enlarged.

Accordingly, the power consumption to record information in an element can be decreased, and also the read-out of the information can be performed easily.

Further, the time required in recording can also be shortened.

Furthermore, since recording of information is performed using a change of the resistance in an element particularly a change of the resistance in an amorphous thin-film, there is an advantage that recording of information and storing of the recorded information become easy, when an element is made minute.

Therefore, according to the present invention, a storage device in which recording of information and reading of the information can be performed easily, the power consumption is decreased and which operates at high speed can be constructed. Also, the integration (toward high density) of the storage device and the miniaturization can be obtained.

Furthermore, a memory element according to the present invention can be manufactured using materials and manufacturing methods that are used for a manufacturing process of a conventional MOS logic circuit and therefore can be manufactured without requiring a particular process such as the high temperature heat treatment and the light irradiation and others.

In other words, a memory element can be manufactured easily by a comparatively simple method.

Therefore, according to the present invention, a memory element and a storage device can be manufactured at small cost, and an inexpensive storage device can be provided. Also the yield of manufacturing a storage device is improved.

According to another memory element and another storage device of the above-mentioned present invention, electric-current required in recording in a memory element can be reduced, and also a change in the resistance of an element before and after the recording can be fully secured.

Accordingly, power consumption to record information in an element can be decreased, and also the read-out of the information can be performed easily.

Further, the time required for recording can also be shortened.

Furthermore, since recording of information is performed using a change of the resistance in an element particularly a change of the resistance in an amorphous thin-film, there is an advantage that recording of information and storing of the recorded information become easy, when an element is made minute.

Further, according to another memory element and another storage device of the above-mentioned present invention, since the stable condition of the high resistance, namely the recoded data can be maintained when used under the high temperature environment or at the time of the long-term preservation, so that reliability thereof can be enhanced.

Accordingly, according to another memory element and another storage device of the present invention, a storage device can be obtained in which recording and the read-out of information can be performed easily, the power consumption can be decreased, the high speed operation can be performed, and the high reliability is secured against heat. Further, the integration (toward high density) of the storage device and the miniaturization can be obtained.

Further, another memory element of the present invention can be manufactured using materials and manufacturing methods that are used for a manufacturing process of a conventional MOS logic circuit.

Therefore, according to another memory element and another storage device of the present invention, a stable memory element and storage device against heat can be manufactured at small cost, and a storage device can be provided inexpensively. Further, the yield of the manufacturing of a storage device is improved.

DETAILED DESCRIPTION OF THE PRESENTLY PREFERRED EMBODIMENTS

Figure 1:
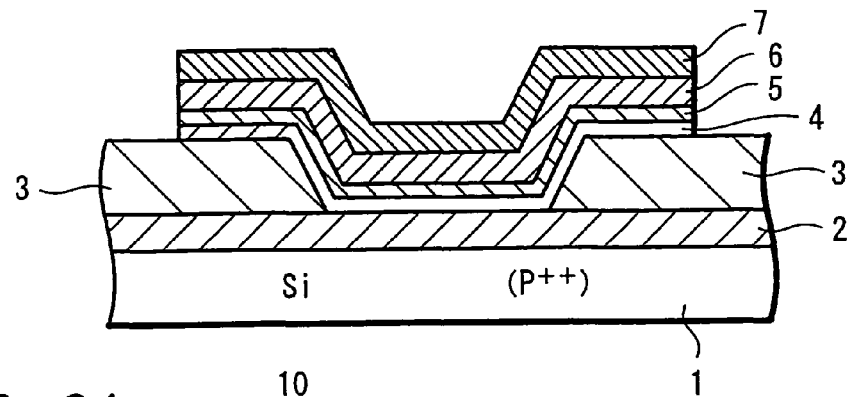
FIG. 1 is a schematic constitutional view (a vertical section) of an embodiment of a memory element according to the present invention.

FIG. 1 shows a schematic constitutional view (a vertical section) as an embodiment of a memory element according to the present invention.

An memory element 10 is composed of a lower electrode 2 formed on a substrate 1 with a high electric conductivity, for example, on a ($P^{++}$) silicon substrate which is doped with a p-type impurity of high density and a multi-layered coating including an amorphous thin-film 4, an upper electrode 5, an electrode layer 6 and a conductive layer 7 formed to connect to the lower electrode 2 through an opening formed in an insulating film 3 on the lower electrode 2.

For example, TiW, Ti and W can be used for the lower electrode 2.

In the case where TiW is used for the lower electrode 2 for example, the coating thickness may be set in the range of 20 nm to 100 nm, for example.

For example, a photo-resist with the hard cure treatment, $SiO_2$ and $Si_3N_4$ conventionally used for a semiconductor device and other materials, for example, SiON, SiOF, $Al_2O_3$, $Ta_2O_5$, $HfO_2$, $ZrO_2$ and others such as an inorganic material and a fluorine-based organic material and an aromatic-based organic material can be used for the insulating film 3, The amorphous thin-film 4 is composed of Ge (germanium) and at least one element selected from S (sulfur), Se (selenium), Te (tellurium) and Sb (antimony). Among those, S, Se and Te belong to the chalcogenide.

For example, GeSbTe, GeTe, GeSe, GeS, GeSbSe, GeSbS, and others can be used. Those materials have the same electric characteristics and chemical characteristics with respect to Ag or Cu.

Further, for example, the amorphous thin-film 4 may contain Si (silicon) and other elements for example Gd and others of rare-earth elements, As, Bi and others, if necessary.

In the case where GeSbTe is used for the amorphous thin-film 4, for example, the coating thickness may be set in the range of 10 nm to 50 nm, for example.

The upper electrode 5 contains Ag or Cu.

The upper electrode 5 can be constructed using a coating of the composition in which for example Ag or Cu is added to the composition of an amorphous thin-film 4, an Ag coating, an Ag alloy coating, a Cu coating, a Cu alloy coating, and others.

In the case where GeSbTeAg is used for the upper electrode 5 for example, the coating thickness may be set in the range of 10 nm to 30 nm, for example. Further, in the case where Ag was used, for example, the coating thickness may be set in the range of 3 nm to 20 nm, for example.

The material, which does not contain Ag or Cu that is contained in the upper electrode 5, is used for the electrode layer 6 which is connected to the upper electrode 5.

Further, the electrode layer 6 is constructed using an element (for example Ti and W and others used for the lower electrode 2) of which the valence when it becomes an ion is larger than Ag or Cu contained in the upper electrode 5.

For example, TiW Ti, W and others used for the lower electrode 2, can be used in the electrode layer 6 as well.

In the case where TiW is used for the electrode layer 6, the coating thickness may be set in the range of 20 nm to 100 nm, for example.

The conductive layer 7 connects a wiring layer, which is not illustrated, and the electrode layer 6 favorably in a low contact resistance.

When TiW is used for the electrode layer 6, for example, it is considered that AlSi is used for the conductive layer 7.

In the case where ALSi was used for the conductive layer 7, the coating thickness may be set in the range of 100 nm to 200 nm, for example.

Note that, the construction in which the conductive layer 7 also functions as a wiring layer connected to the memory element 10, and the wiring layer is directly connected to the electrode layer 6 can also be used.

The memory element 10 of an embodiment of the present invention is made to operate as follows, and information can be memorized.

First, a positive potential (+ potential) is applied to the upper electrode 5 which contains Ag or Cu, and a positive voltage is applied to the memory element 10 so that the side of an upper electrode 5 becomes positive. With this, Ag or Cu becomes ionized from the upper electrode 5; diffuses into the amorphous thin-film 4; is combined with the electron on the side of the lower electrode 2, and is separated out.

Then, Ag or Cu increases inside the amorphous thin-film 4, and the resistance of the amorphous thin-film 4 becomes low. Because the resistance of the other layers than the amorphous thin-film 4 is low from the first, the whole resistance of the memory element 10 can be made low with making the resistance of the amorphous thin-film 4 low.

Subsequently, the positive voltage is removed, and when a voltage applied to the memory element 10 is prevented, the condition in which the resistance became low is maintained. Accordingly, it becomes possible to record information.

On the other hand, when the recorded information is erased, a negative potential (− potential) is applied to the upper electrode 5 which contains Ag or Cu and a negative voltage is applied to the memory element 10 so that the side of the upper electrode 5 becomes negative. With this, Ag or Cu which has been separated out on the side of the lower electrode 2 becomes ionized; moves inside the amorphous thin-film 4; and is returned to the original state on the side of the upper electrode 5.

Then, Ag or Cu decreases inside the amorphous thin-film 4, and the resistance of the amorphous thin-film 4 becomes high. Because the resistance of other layers than the amorphous thin-film 4 is low from the first, the whole resistance of the memory element 10 can be made high by making the resistance of the amorphous thin-film 4 high.

Subsequently, a negative voltage is removed, and when a voltage applied to the memory element 10 is removed, the condition in which the resistance is high is maintained. Accordingly, it becomes possible to erase the information.

By repeating such process, the recording (writing) of information and the erasing of the recoded information can be performed repeatedly with respect to the memory element 10.

Further, for example, when the state in which the resistance is high is made to correspond to information"0" and the state in which the resistance is low is made to correspond to the information "1" respectively, "0" can be changed into "1" in an information recording process by applying a positive voltage and "1" can be changed into "0" in an information erasing process by applying a negative voltage.

Note that, the amorphous thin-film 4 remains the amorphous (non-crystal) state in the above-mentioned information recording and erasing processes, and a phase change is never caused to be crystalline.

In other words, the recording and erasing of information is performed on the voltage condition that the phase change does not occur in the amorphous thin-film 4.

According to the construction of the memory element 10 of the above-mentioned embodiment, an amorphous thin-film 4 is composed of Ge and at least one element selected from S, Se, Te and Sb, and an upper electrode 5 contains Ag or Cu, so that information can be recorded by making Ag or Cu diffuse from the upper electrode 5 and move into the amorphous thin-film 4 as an ion.

Then, because recording of information is performed using a change of the resistance of a memory element 10, particularly using a change of the resistance of an amorphous thin-film 4, when the memory element 10 is made minute, information recording and maintaining the recorded information can be performed easily.

Further, because an amorphous thin-film 4 does not contain Ag or Cu that becomes an ion, on the condition before recording information and on the condition that the information is erased, Ag or Cu gathers around the interface between an upper electrode 5 and the amorphous thin-film 4 and the resistance of the amorphous thin-film 4 can be made high because Ag or Cu hardly diffuse to the inside of the amorphous thin-film 4.

Accordingly, on the condition before information recording and on the condition that the information is erased, the resistance of an element 10 can be made high, and a change of the resistance can be enlarged in comparison with the low resistance in the state in which the information is recorded.

Therefore, reading and discrimination of the recorded information becomes easy.

Further, the electric current which is necessary for recording can be made small. This is considered that Ag or Cu does not exist to excess in an amorphous thin-film 4, so that the ionic movement of Ag or Cu is performed smoothly. The power consumption can be decreased because the electric current which is necessary for the recording can be made small.

Further, the time required for the recording can also be shortened.

Furthermore, according to the construction of a memory element 10 of the above-mentioned embodiment, each of a lower electrode 2, an amorphous thin-film 4, an upper electrode 5, an electrode layer 6 and a conductive layer 7 can be composed of materials that sputtering can be employed. The sputtering using the target which consists of the composition that is suitable for the material of each layer may be performed.

Therefore, no particular process such as the heat treatment at a high temperature and the optical irradiation (a process in which a metal is made to diffuse from an electrode) is necessary.

Further, the coating can be formed continuously by exchanging a target in the same sputtering device.

Specifically, a memory element can be manufactured by means of material used in a manufacturing process of a conventional MOS logic circuit and a manufacturing method (such as the coating formed by sputtering electrode material, a conventional etching process such as plasma or RIE etching and others).

Therefore, a memory element 10 can be manufactured easily by means of a comparatively simple method.

For example, a memory element 10 of FIG. 1 can be manufactured as follows.

First, a lower electrode 2, for example a TiW coating is accumulated on a substrate 1 that has a high electric conductivity, for example, on a silicon substrate where a P-type impurity of high concentration is doped.

Next, an insulating film 3 is formed to cover the lower electrode 2, after that, an opening is formed in the insulating film 3 on the lower electrode 2.

Then, the oxidized surface on the surface of the lower electrode 2 is etched, and a thin oxide coating is removed to obtain an electrically excellent surface.

Subsequently, an amorphous thin-film 4, for example a GeSbTe coating is made by a magnetron sputtering device, for example.

Then, an upper electrode 5, for example, a GeSbTeAg coating or a Ag coating is made by a magnetron sputtering device, for example.

Subsequently, an electrode layer 6, for example, a TiW coating is made and a conductive layer 7, for example, an AlSi coating or a Cu coating is made, by a magnetron sputtering device, for example.

And the amorphous thin-film 4, upper electrode 5, electrode layer 6 and conductive layer 7 can be formed continuously with each material being selected, using the same magnetron sputtering device with being held in the same vacuum state, and by exchanging the target of sputtering.

Subsequently, the amorphous thin-film 4, upper electrode 5, electrode layer 6 and conductive layer 7 are patterned by plasma etching and others, for example. Patterning can also be performed by such etching methods as ion milling and RIE (the reactive ion etching) and others, other than the plasma etching.

As described above, a memory element 10 shown in FIG. 1 can be manufactured.

Note that, in the memory element 10 of the above-mentioned embodiment, though an upper electrode 5 is constructed to contain Ag or Cu and a lower electrode is constructed not to contain Ag or Cu, such construction as Ag or Cu being contained only in a lower electrode and Ag or Cu being contained in both the lower electrode and upper electrode can be employed.

When the construction in which Ag or Cu is contained in the lower electrode is taken, it is desirable to provide an electrode layer equivalent to an electrode layer 6 of FIG. 1 (composed of an element whose valence is larger than Ag or Cu, when it is ionized) between the lower electrode and a substrate.

Figure 15:
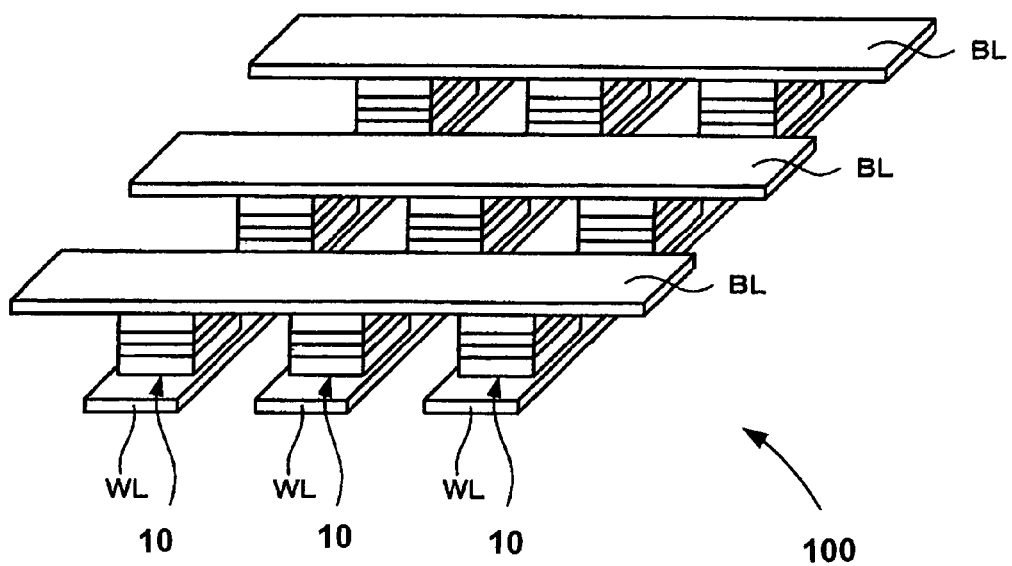
FIG. 15 illustrates a storage device having a large number of matrices-shaped memory elements, with each memory element arranged at the crossing of two wirings.

FIG. 15 shows a schematic of a storage device 100. The storage device (the memory device) 100 can be constructed by arranging a large number of matrices-shaped memory elements 10 of the above mentioned embodiment.

A bit line (BL) wiring connected to the side of the lower electrode 2 and a word line (WL) wiring connected to the side of the upper electrode 5 are provided for each memory element 10, and each memory element 10 is arranged around the crossings of those BL and WL wirings, for example. Hereafter, the BL and WL wirings will be commonly referred to as wirings along their corresponding connection to the memory elements 10 and the storage device 100, for specificity Further, specifically, the lower electrode 2 is, for example, formed in common with respect to the memory cells in the column direction; the wiring connected to the conductive layer 7 is formed in common with respect to the memory cells in the row direction; a memory cell to be recorded is selected by selecting the lower electrode 2 and wiring by applying a potential; and recording of information and erasing of the recoded information can be performed by the electric current flowing into the memory element 10 of this memory cell.

With respect to the memory element 10 of the above-mentioned embodiment, recording of information and reading of the information can be performed easily, the power consumption can be reduced and the recording time can be made short. Therefore, when a storage device is constructed using the memory element 10, information recording and reading of the recorded information can be performed easily; the power consumption of the whole storage device can be reduced; and the high speed operation can be obtained, Further, with the memory element 10 of the above-mentioned embodiment, recording information and preserving the recorded information can easily be performed when miniaturized, so that the integration (toward high density) and miniaturization of the storage device can be obtained.

Furthermore, since the memory element of the above-mentioned embodiment can be manufactured easily by the simple method, the manufacturing cost of the storage device can be reduced and a yield of manufacturing can be improved.

Practice Examples

Next, a memory element 10 of the above-mentioned embodiment was actually made, and a characteristic thereof was studied.

<Experiment 1>

First, a TiW coating of 100 nm in thickness was accumulated by sputtering as a lower electrode 2 on a substrate 1 having high electric conductivity, for example, on a silicone substrate where the p-type impurity of high concentration is doped.

Next, a photo-resist was formed to cover the lower electrode 2, and after that, exposure and development were performed by photo-lithography to form an opening (through-hole) in the photo-resist on the lower electrode 2. The size of the opening (through-hole) was 2 μm as a longitudinal length and 2 μm as a cross length.

Subsequently, annealing was performed at 270 degree centigrade in the vacuum to change a photo-resist into a hard-cure resist of an insulating film 3 which was stable against temperature, etching and others. Note that, a hard-cure resist was used for the insulating film 3 because it could be formed without difficulty for the experiment, and therefore it is considered that other materials (silicon oxide coating and others) may be used as the insulating film 3 when the product is manufactured.

Subsequently, the etching on the surface of the lower electrode 2 exposed by a through hole was performed, and a thin oxide coating was removed to obtain an electrically excellent surface.

Next a GeSbTe coating of 25 nm in coating thickness was formed by a magnetron sputtering device as an amorphous thin-film 4. The composition of the GeSbTe coating was $Ge_{22}Sb_{22}Te_{56}$ (numbers added are the percentage of atomic volume).

Further, a GeSbTeAg coating of 25 nm in coating thickness was formed as an upper electrode 5 by the same magnetron sputtering device with the same vacuum state kept. The composition of the GeSbTeAg coating was $(Ge_{22}Sb_{22}Te_{56})_{41}Ag_{59}$ (numbers added are the percentage of atomic volume).

Furthermore, a TiW coating of 100 nm in coating thickness was formed as an electrode layer 6 by the same magnetron sputtering device with the same vacuum state kept and then, an AlSi coating of 100 nm in coating thickness was formed as a conductive layer 7. The compositions of the TiW coating and AlSi coating were $Ti_{50}W_{50}$ and $Al_{97}Si_3$ (numbers added are the percentage of atomic volume), respectively.

Subsequently, patterning of the size of 50 μm×5 μm was performed on each layer of the amorphous thin-film 4, upper electrode 5, electrode layer 6 and conductive layer 7, which was accumulated on the insulating film 3 made of the hard-cure resist, by the photo-lithography using a plasma etching device.

As described above, the memory element 10 of the structure shown in FIG. 1 was made, and it was a sample 1 of the memory element 10.

With respect to this sample 1 of the memory element 10, a positive potential (+ potential) was applied to the conductive layer 7 of the side of the upper electrode 5, and an earth potential (a ground potential) was connected to the rear side of the substrate 1.

Then, a positive potential applied to the conductive layer 7 was increased from 0V, and a change of the electric current was measured. However, the current limiter was set to work when the electric current reached 0.5 mA, so that a positive potential applied to the conductive layer 7, namely a voltage applied to an element 10 might not increase more than that.

Further, from the electric current reached 0.5 mA with the the current limiter worked, a positive potential applied to a conductive layer 7 was made to decrease to 0V, and a change of the electric current was measured.

Figure 2A:
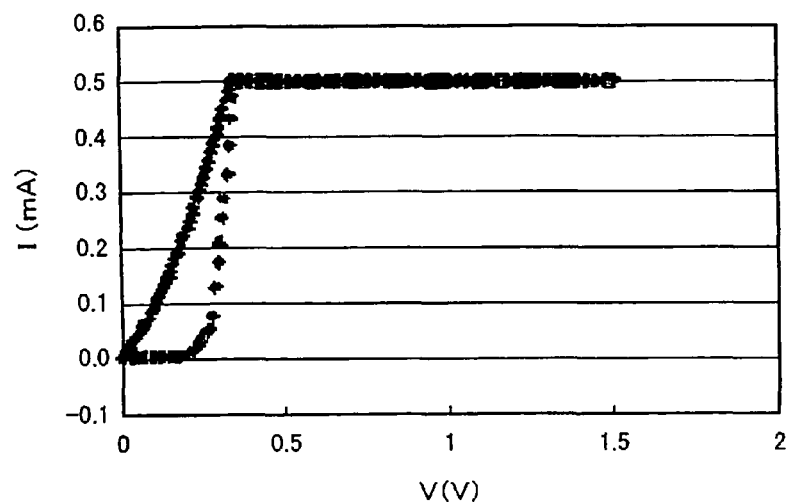
FIG. 2A is a diagram that shows a result of measurement of an I-V characteristic of a sample of the memory element of FIG. 1.

A graph of the obtained I-V characteristic is shown in FIG. 2A.

In FIG. 2A, it is understood that the resistance is high at the initial state and the memory element 10 is in the off-state, and the electric current increases rapidly with the voltage that goes beyond a threshold voltage Vth; in other words the resistance becomes low to enter the on-state. It is understood that information is recorded by this.

On the other hand, after that, by decreasing the voltage, the electric current also decreases; though the amount of the decrease of the electric current is larger and the resistance rises little by little, the finally reached resistance value is sufficiently lower than the initial resistance value, and the on-state is kept and it is understood that the recorded information is preserved.

The resistance value at the voltage V=0.1V is approximately 2 MΩ under the off-state and approximately 1 kΩ under the on-state in the case of this sample 1.

And, though it is not in the characteristic view of FIG. 2A, the voltage V of the reverse polarity, namely a negative potential (− potential) is applied to the conductive layer 7 on the side of the upper electrode 5, and the rear side of a substrate 1 is connected to the earth potential (the ground potential), and a negative potential of V=−1V is applied to the conductive layer 7, after that, by setting the potential of the conductive layer 7 to 0V, it is confirmed that the resistance goes back to the high resistance of the initial state. In other words, it is understood that the information recorded in the memory element 10 can be erased by applying a negative voltage.

<Experiment 2>

Ag was added to GeSbTe of an amorphous thin-film 4, and a characteristic was studied.

First, a GeSbTeAg coating whose composition was $(Ge_{22}Sb_{22}Te_{56})_{81}Ag_9$ (numbers added are the percentage of atomic volume, hereinafter the same as this) was formed as an amorphous thin-film 4, and with others were the same as those of the sample 1, a memory element was made to be a sample 2.

Next, a GeSbTeAg coating whose composition was $(Ge_{22}Sb_{22}Te_{56})_{70}Ag_{30}$ was formed as an amorphous thin-film 4, and others were the same as those of the sample 1, and a memory element was made to be a sample 3.

Next, a GeSbTeAg coating whose composition was $(Ge_{22}Sb_{22}Te_{56})_{58}Ag_{42}$ was formed as an amorphous thin-film 4, and others were the same as those in the sample 1, and a memory element was made to be a sample 4.

I-V characteristic of each memory element of those samples 2 to 4 was measured. A result of measurement of the sample 2 is shown in FIG. 2B, and a result of measurement of the sample 3 is shown in FIG. 3A, and a result of measurement of the sample 4 is shown in FIG. 3B.

Figure 2B:
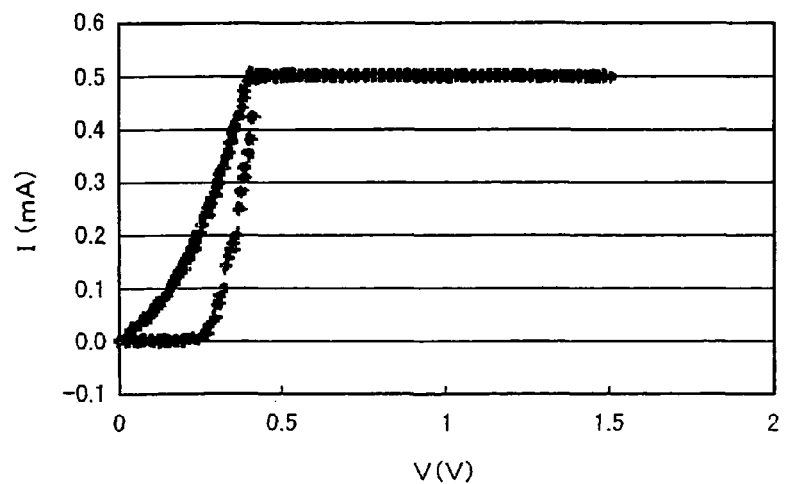
FIG. 2B is a diagram that shows a result of measurement of the I-V characteristic of a sample that Ag was added to an amorphous thin-film.
Figure 3A:
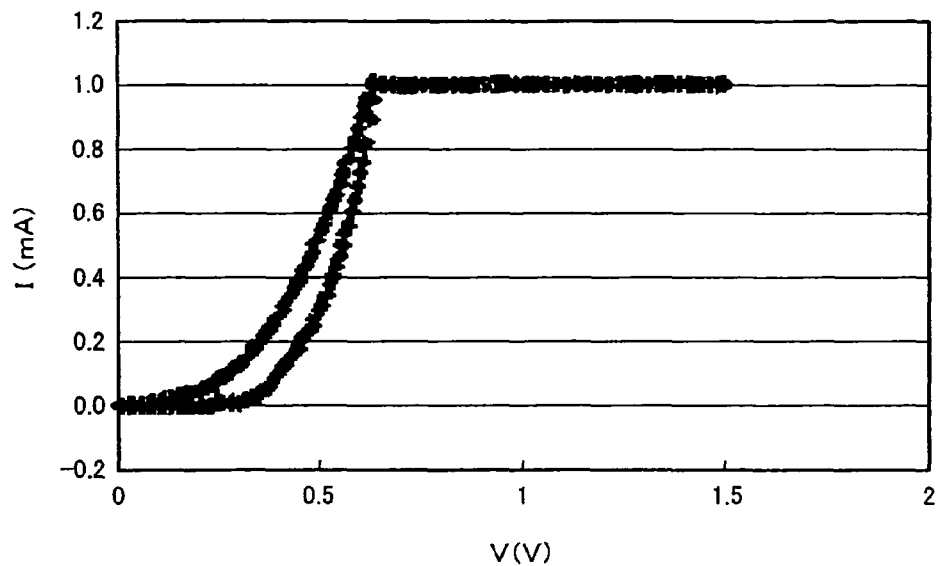
FIGS. 3A and 3B are diagrams that show a result of measurement of the I-V characteristic of a sample that Ag was added to an amorphous thin-film.
Figure 3B:
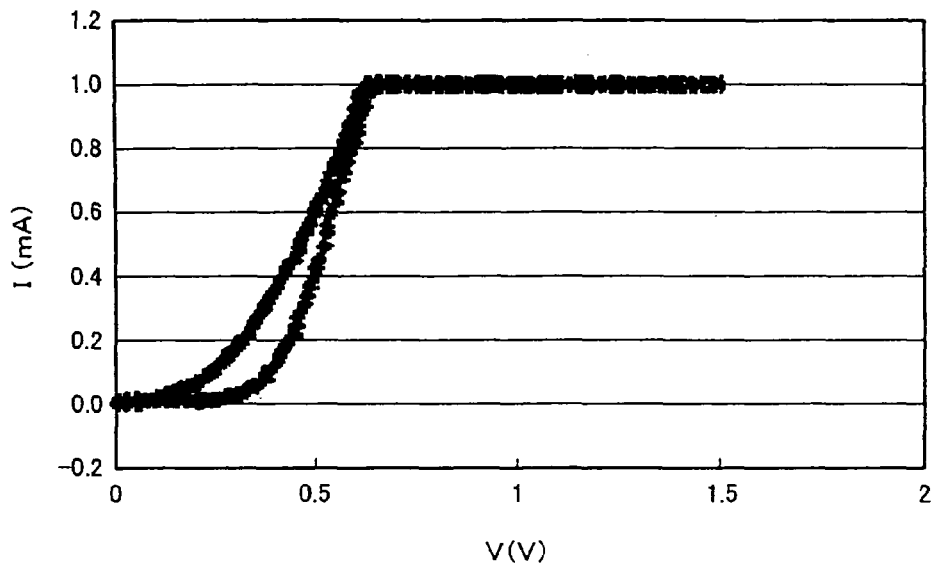

As shown in FIGS. 2B, 3A and 3B, the threshold voltage Vth becomes high when the voltage is made to increase in response to the increase of the content of the silver Ag, and it is understood that the dI/dV that is the inclination of the I-V after it went over the threshold voltage Vth, namely the change rate of the resistance becomes gentle.

If the mechanism that resistance changes is that, for example, according to the movement to the side of a negative electrode, the narrow electric current pass of having a low resistance and a locally high Ag concentration is formed in the electric field of the Ag ion which is contained in the upper electrode 5, it can be considered by that the voltage that an electric current pass is formed rises a little and the formation speed of the electric current pass becomes slow or the dispersion of the voltage that many electric current passes are formed becomes high, by the addition of Ag to GeSbTe.

Also, for FIGS. 3A and 3B, namely the sample 3 and the sample 4, in the case where the electric current limiter is set to 0.5 mA, the resistance is returned when electric current is returned to 0V, and it brought the result that a record could not be held, so that the result that the value of electric current limiter was set to 1 mA and measured result is shown.

Furthermore, though the change rate of the resistance before and after the recording in the sample 1 of FIG. 2A was 400 times, the sample 2 of FIG. 2B was 80 times, and the sample 3 of FIG. 3A and a sample 4 of FIG. 3B were 7 times, respectively.

In other words, though each sample has a comparatively small resistance when the voltage which is larger than the threshold voltage is applied at the time of the recording, it is understood that the change rate of the resistance decreases by the cause of that the increase rate of the resistance becomes large again in accordance with decreasing the voltage that is applied.

Specifically, it is assumed that it becomes difficult to maintain the on-state that was recorded when the content of Ag increases.

From the above result, to make GeSbTe of an amorphous thin-film 4 contain Ag in advance brings the increase of the recording voltage and the recording electric current, and by that, either a problem of the dispersion of the recording voltage or of the decline in the recording speed occurs, moreover it is found that the problems that the decrease of the rate of the amount of resistance change, namely the decrease of the signal level when it began to read, and the preservation characteristic of the recorded data was weakened.

Therefore, it is desirable to make a memory element 10 such that an amorphous thin-film 4 does not contain Ag or Cu which is contained in an upper electrode 5.

<Experiment 3>

Next, the content of Ge of a GeSbTe coating of an amorphous thin-film 4 was changed, and a characteristic was studied.

First, a Ti coating of 100 nm in coating thickness was formed as a lower electrode 2 and an electrode layer 6 instead of a TiW coating, and others were the same as those in the sample 1 and a memory element was made to be a sample 5.

Next, a GeSbTe coating whose composition was $Ge_3Sb_{17}Te_{50}$ is (numbers added are the percentage of atomic volume, hereinafter the same as this) was formed as an amorphous thin-film 4, and others were the same as those in the sample 1 and a memory element was made to be a sample 6.

Next, a GeSbTe coating whose composition was $Ge_{38}Sb_{17}Te_{45}$ is formed as an amorphous thin-film 4, and others were the same as those in the sample 1 and a memory element was made to be a sample 7.

Next, a GeSbTe coating whose composition was $Ge_{49}Sb_{17}Te_{37}$ is formed as an amorphous thin-film 4, and others were the same as those in the sample 1 and a memory element was made to be a sample 8.

Figure 4A:
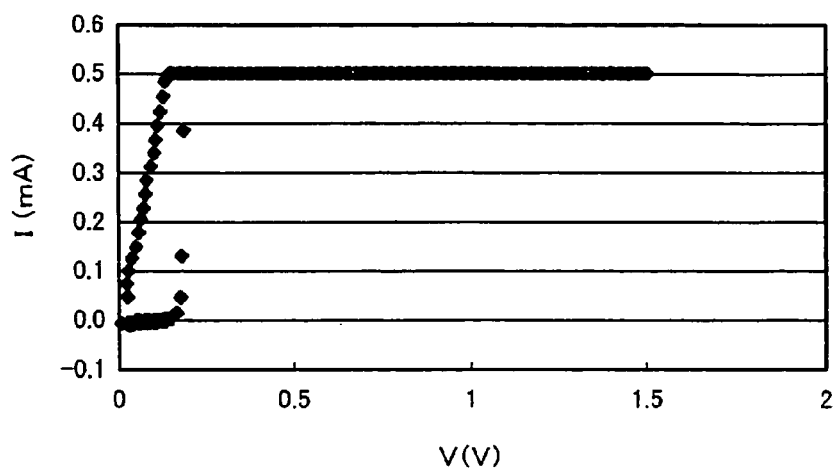
FIG. 4A and FIG. 4B are diagrams that show a result of measurement of the I-V characteristic of a sample in which the content of Ge in an amorphous thin-film is changed.
Figure 4B:
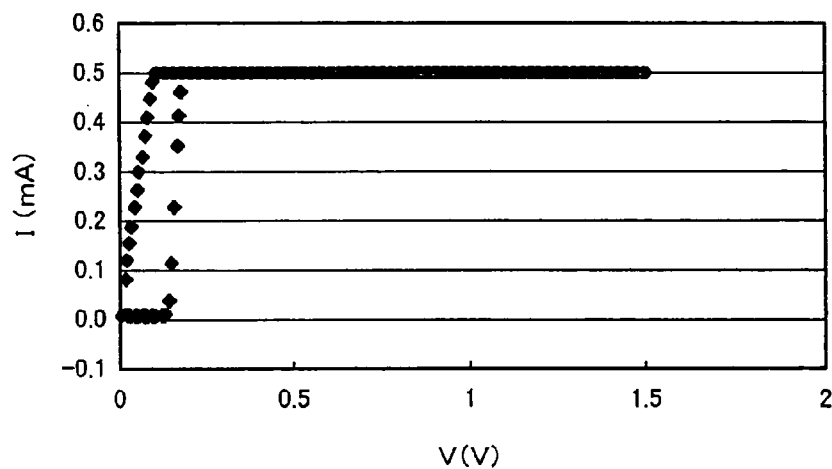

The I-V characteristic of each memory element of those samples 5 to 8 is measured. The measurement result of the sample 5 is shown in FIG. 4A, and the measurement result of the sample 6 is shown in FIG. 4B, and the measurement result of the sample 7 is shown in FIG. 5A, and the measurement result of the sample 8 is shown in FIG. 5B.

As shown in FIGS. 4A to 5B, it is confirmed that recording and the preservation of the record could be performed properly in those wide Ge composition ranges.

Figure 5A:
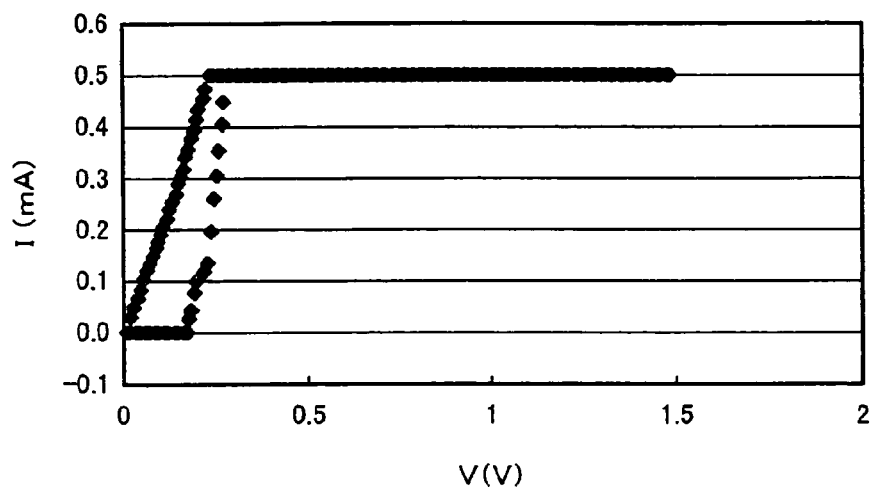
FIGS. 5A and 5B are diagrams that show a result of measurement of the I-V characteristic of a sample in which the content of Ge in an amorphous thin-film is changed.
Figure 5B:
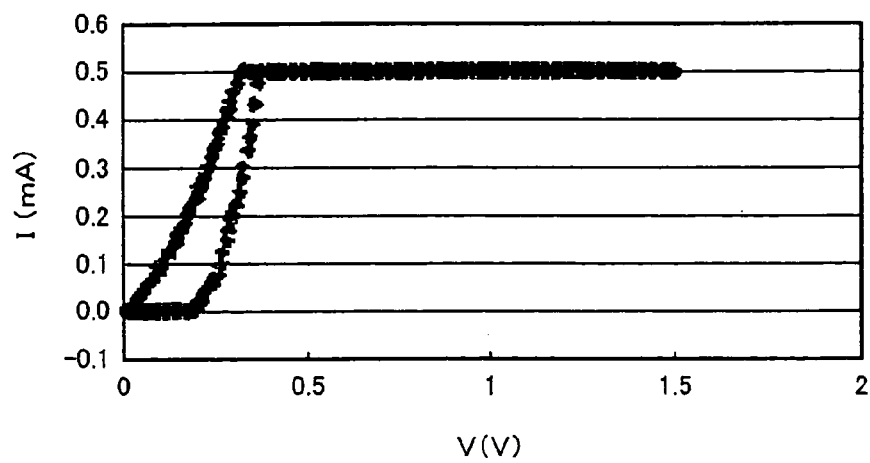

And, from FIGS. 5A and 5B, it is understood that if the content of Ge increases, the dI/dV becomes gentle when a voltage beyond a threshold voltage is applied. There is an advantage that stability against the heat of the memory element improves when the content of Ge is increased, though recording becomes easier as much as the content of Ge is small, in view of the characteristic of a memory.

Therefore, the content of Ge should be controlled depending on the characteristic which is required.

<Experiment 4>

Next, the material of a lower electrode 2 and an electrode layer 6 was changed, and a characteristic thereof was studied.

A W coating of 100 nm in coating thickness was formed as a lower electrode 2 and an electrode layer 6 instead of a TiW coating, and others were the same as those in the sample 1, and a memory element was made to be a sample 9.

The I-V characteristic of the memory element of this sample 9 was measured. That result of measurement is shown in FIG. 6.

Figure 6:
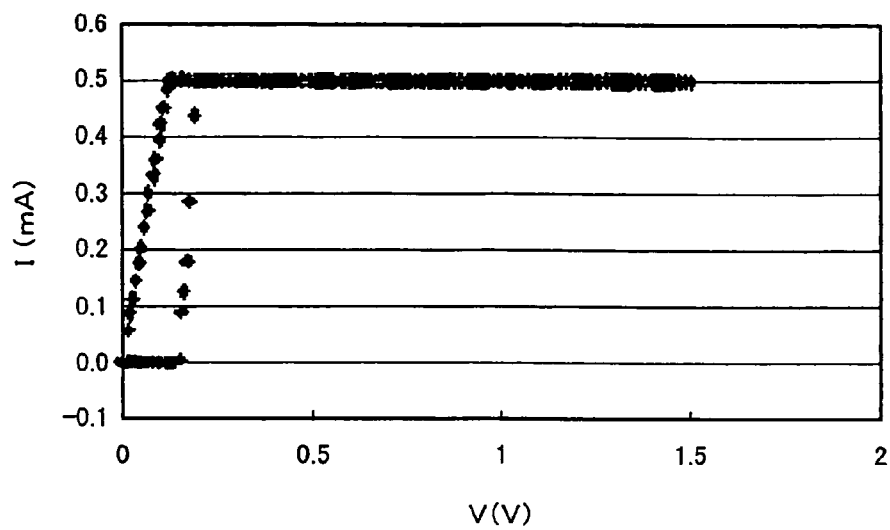
FIG. 6 is a diagram that shows a result of measurement of the I-V characteristic of a sample in which W is used for the lower electrode and an electrode layer.

According to FIG. 6, it is understood that an excellent I-V characteristic the same as FIG. 2A and others was obtained, and recording can be performed easily.

Further, an excellent I-V characteristic the same as the sample 1 and others was obtained, when the sample in which the lower electrode 2 and the electrode layer 6 were changed to a TiW coating other than $Ti_{50}W_{50}$, to a multi-layered coating of Ti/TiW, to a multi-layered coating of TiW/Ti to a multi-layered coating of TiW/W and to a multi-layered coating of W/TiW of the composition was made respectively and measurement was performed.

Furthermore, an excellent I-V characteristic the same as the sample 1 was obtained, when the conductive layer 7 was changed to a Cu coating and a sample was made in the same way and measurement was performed.

<Experiment 5>

Next, an Ag coating instead of a GeSbTeAg coating was used as the upper electrode 5 which contained Ag, and a characteristic was studied.

The Ag coating of 6 nm in coating thickness instead of a GeSbTeAg coating was formed as the upper electrode 5, and others were the same as those in the sample 1, and a memory element was made to be a sample 10.

The I-V characteristic of a memory element of this sample 10 was measured. The result of measurement is shown in FIG. 7.

Figure 7:
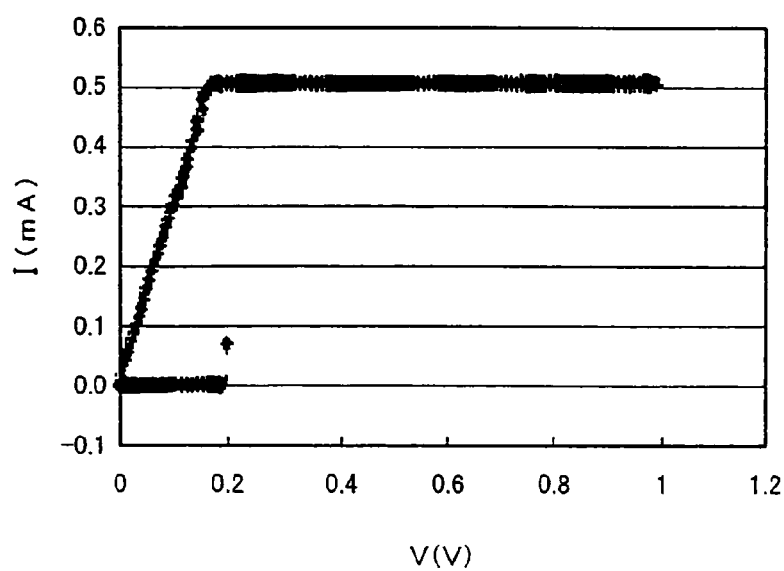
FIG. 7 is a diagram that shows a result of measurement of the I-V characteristic of a sample in which an amorphous thin-film is an Ag film.

In FIG. 7, the same as FIG. 2A and others, it is understood that an excellent I-V characteristic is obtained and recording can be performed easily. Particularly, it is understood that the dI/dV at the time of recording is greatly steep in comparison with FIG. 2A.

Then, when the result of FIG. 7 and the results of FIGS. 2A to 3B are taken into consideration, it is understood that the dI/dV at the time of recording is steeper as much as the difference between the concentration of Ag or Cu that an upper electrode 5 contains and the concentration of Cu or Ag that an amorphous thin-film 4 contains is large, and an excellent recording characteristic can be obtained.

Note that, when the coating thickness of Ag coating was changed and a sample was made and a similar measurement was performed, a similar I-V characteristic was obtained if the coating thickness was equal to or more than 3 nm.

<Experiment 6>

An impurity metal which was different from Ag and Cu which become an ion mediation, specifically Gd which was a rare-earth metal was added in an amorphous thin-film 4, and a characteristic was studied.

First, a GeSbTeGd coating whose composition was $(Ge_{22}Sb_{22}Te_{56})_{89}Gd_{11}$ (numbers added are the percentage of atomic volume, hereinafter the same as this) was formed as the amorphous thin-film 4, and others were the same as those in the sample 1 and a memory element was made to be a sample 11.

Next, a GeSbTeGd coating whose composition was $(Ge_{22}Sb_{22}Te_{56})_{82}Gd_{18}$ was formed as an amorphous thin-film 4, and others were the same as those in the sample 1 and a memory element was made to be a sample 12.

The I-V characteristic of each memory element of those samples 11 and 12 was measured. A result of measurement of a sample 11 is shown in FIG. 8A, and a result of measurement of a sample 12 is shown in FIG. 8B.

Figure 8A:
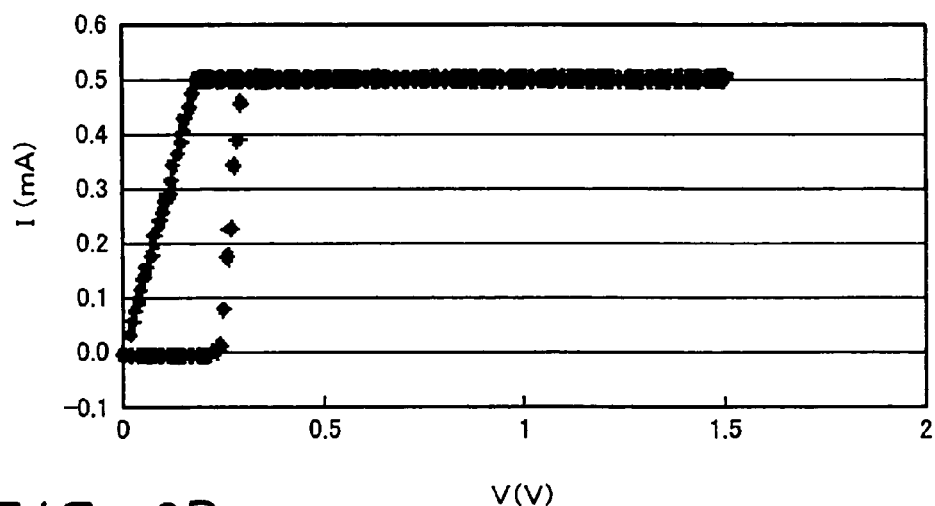
FIGS. 8A and 8B are diagrams that show a result of measurement of the I-V characteristic of a sample in which Gd was added to an amorphous thin-film.
Figure 8B:
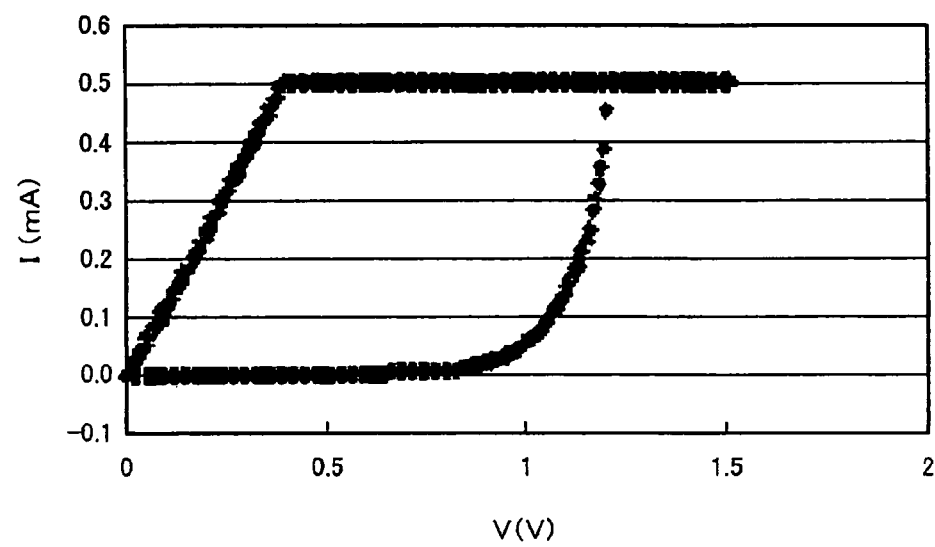

It was confirmed that recording and the preservation of the record could be performed properly as shown in FIG. 8A and FIG. 8B in this case as well.

Further, the resistance value before recording rose and became more than 1 MΩ and furthermore, after it was left under the high temperature, the effectiveness that the resistance value is stable was obtained by the addition of a rare-earth element Gd, and with which the resistance value sample of a sample 11 and a sample 12 for the annealing at 270 degree centigrade of one hour was hardly changed.

In other words, it is assumed that the crystallization temperature rises, and the amorphous state is kept in the stability by the addition of a rare-earth element.

Further, because the threshold voltages increases by the addition of a rare-earth element, for example, it is efficient when the voltage at the time of the reproducing (read out) is made to set up high.

Since rare-earth elements have the same outer electron structure and have an electrically equal characteristics regardless of a kind, it is not limited to Gd and when each element of La, Ce, Pr, Nd, Sm, Eu, Tb, Dy, Ho and Er is used, a similar effectiveness is expected.

<Experiment 7>

An impurity element, Si specifically was added to an amorphous thin-film 4 and a characteristic was studied.

First, a GeSbTeSi coating whose composition was $(Ge_{22}Sb_{22}Te_{56})_{93}Si_{7}$ (numbers added are the percentage of atomic volume, hereinafter the same as this) was formed as the amorphous thin-film 4, and others were the same as those in the sample 1 and a memory element was made to be a sample 13.

Next, a GeSbTeSi coating whose composition was $(Ge_{22}Sb_{22}Te_{56})_{85}Si_{15}$ was formed as the amorphous thin-film 4, and others were the same as those in the sample 1 and a memory element was made to be a sample 14.

Next, a GeSbTeSi coating whose composition was $(Ge_{22}Sb_{22}Te_{56})_{77}Si_{23}$ was formed as the amorphous thin-film 4, and others were the same as those in the sample 1 and a memory element was made to be a sample 15.

The I-V characteristic of each memory element of those samples 13 to 15 was measured. A result of measurement of the sample 13 is shown in FIG. 9A, and a result of measurement of the sample 14 is shown in FIG. 9B, and a result of measurement of the sample 15 is shown in FIG. 9C.

Figure 9A:
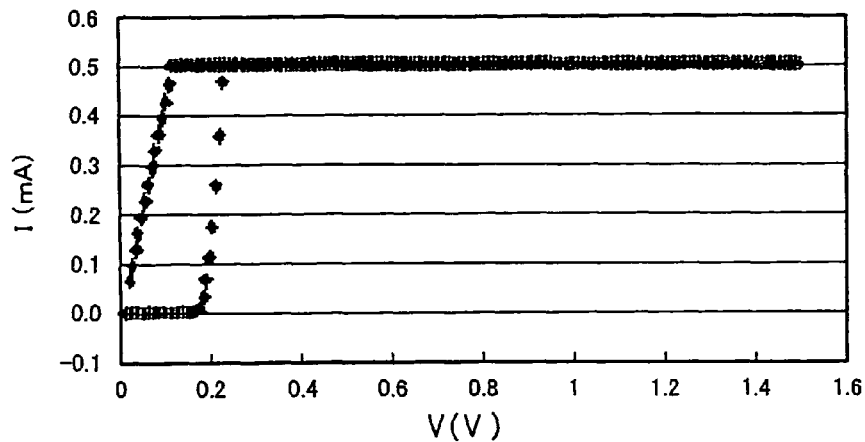
FIGS. 9A to 9C are diagrams that show a result of measurement of the I-V characteristic of a sample in which Si is added to an amorphous thin-film.
Figure 9B:
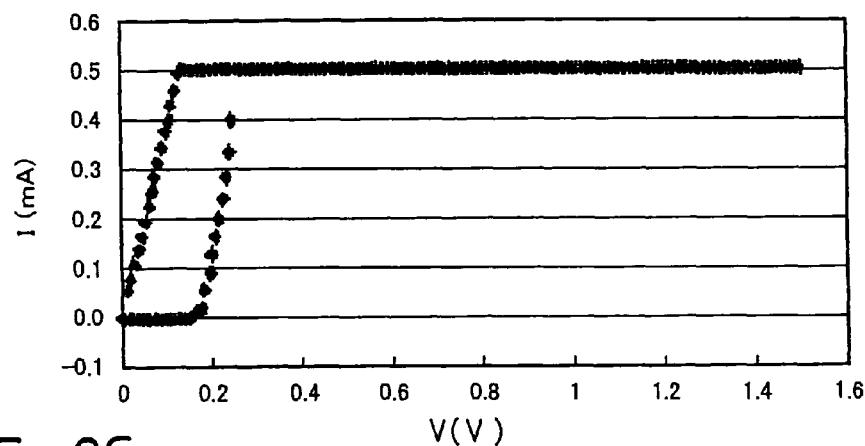

In FIGS. 9A and 9B, the I-V characteristic almost did not change until the addition of Si was approximately less than 15 percentages of atomic volume, and it is confirmed that recording and the preservation of the record could be performed properly.

Figure 9C:
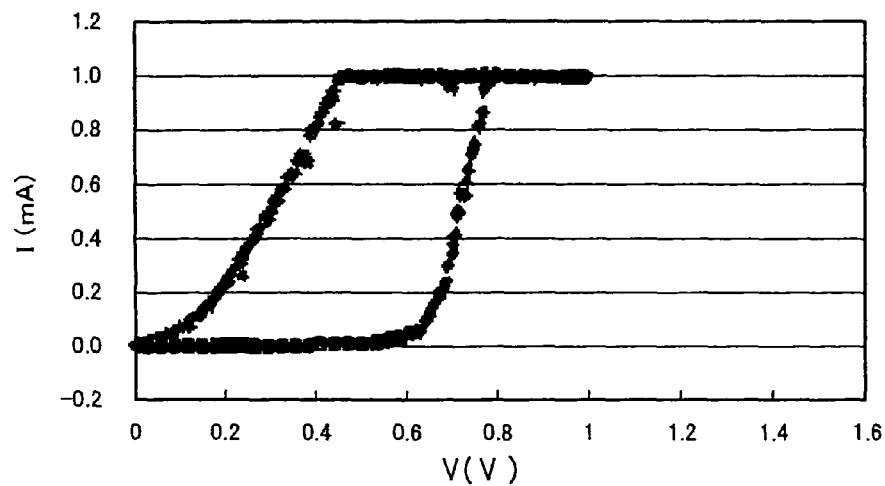

On the contrary, as shown in FIG. 9C, the threshold voltages increases when the amount of addition of Si is set to 23 percentages of atomic volume, so that the recording with 0.5 mA becomes difficult, and the electric current of approximately 1 mA is needed.

Note that, the thermal stability can be expected to increase by adding Si to GeSbTe of the amorphous thin-film 4. This is because a covalent bond energy which Si—Si has is high, the melting point of an Si substance is high, and the melting point is being raised as much as the amount of Si is large in the Si—Ge alloy compound, when Si was added to GeSbTe, a covalent bond rises in the same way, so that it is expected that the melting point and crystallization temperature rise by the addition of Si.

<Experiment 8>

A coating thickness of an amorphous thin-film 4 was changed, and a characteristic was studied.

First, a lower electrode 2 was a Ti coating of coating thickness 20 nm, and a coating thickness of a GeSbTe coating of the amorphous thin-film 4 was 14 nm, and others were the same as those in the sample 1 and a memory element was made to be a sample 16.

Next the coating thickness of a GeSbTe coating of the amorphous thin-film 4 was 25 nm, and others were the same as those in the sample 16 and a memory element was made to be a sample 17.

In addition, in the sample 17, the coating thickness of a GeSbTe coating of the amorphous thin-film 4 was the same as that in the sample 1.

Next the coating thickness of a GeSbTe coating of the amorphous thin-film 4 was 38 nm, and others were the same as the sample 16 and a memory element was made to be a sample 18.

Next the coating thickness of a GeSbTe coating of an amorphous thin-film 4 was 51 nm, and others were the same as the sample 16 and a memory element was made to be a sample 19.

Figure 10A:
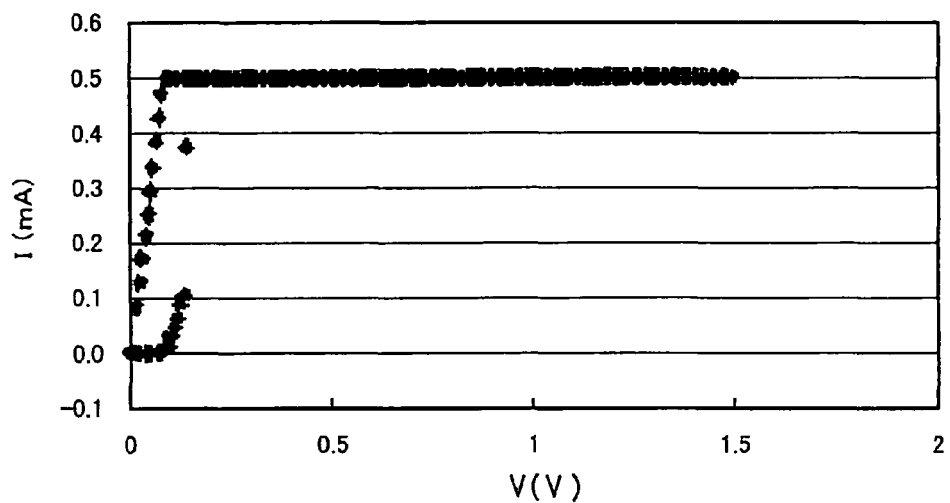
FIGS. 10A and 10B are diagrams that show a result of measurement of the I-V characteristic of a sample in which the coating thickness of GeSbTe film of an amorphous thin-film is changed.
Figure 10B:
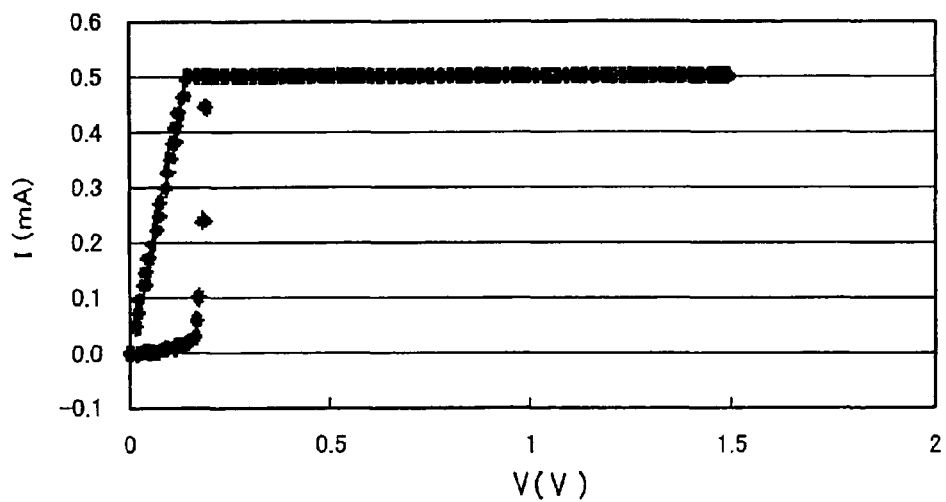
Figure 11A:
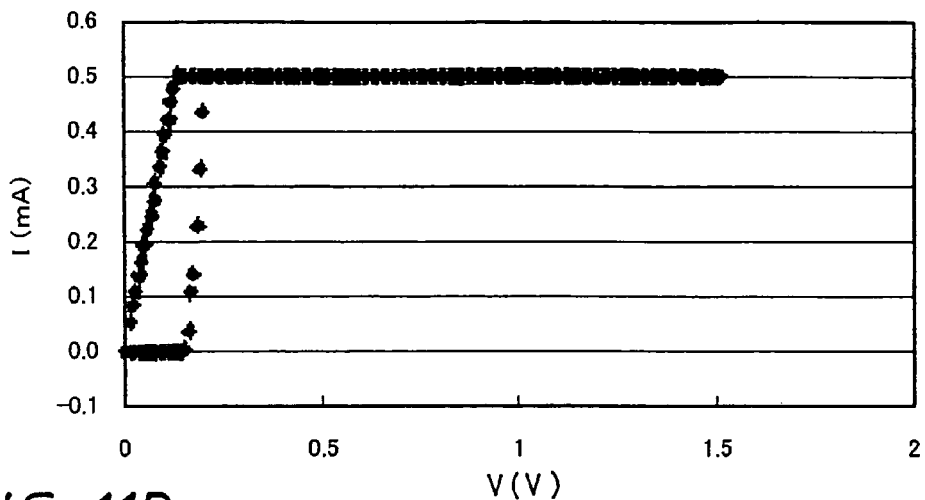
FIGS. 11A and 11B are diagrams that show a result of measurement of the I-V characteristic of a sample in which the coating thickness of GeSbTe film of an amorphous thin-film is changed.
Figure 11B:
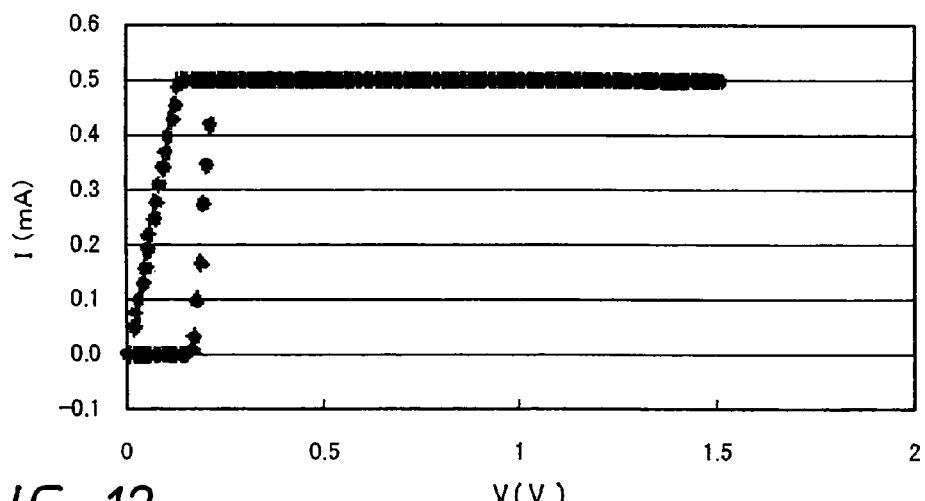

The I-V characteristic of each memory element of those samples 16 to 19 was measured. A result of measurement of the sample 16 is shown in a FIG. 10A, and a result of measurement of the sample 17 is shown in FIG. 10B, and a result of measurement of the sample 18 is shown in FIG. 11A, and a result of measurement of the sample 19 is shown in FIG. 11B.

It is confirmed that recording and the preservation of the record could be performed properly as shown in FIGS. 10A to 11B in those wide coating thickness ranges.

Note that, though the threshold voltage lowers with approximately 0.1V in the sample 16 (FIG. 10A) whose coating thickness is thinnest, in all others the threshold voltage did not change that much regardless of a coating thickness, and all others are approximately 0.17V.

In addition, in a memory element 10 of the above-mentioned embodiment, a silicon substrate of the high impurity concentration that the conductivity is high was used for a substrate 1 and the earth potential (the ground potential) is applied to the rear side of the substrate 1; however, the composition which applies a voltage to the side of a lower electrode was not limited thereto and other compositions can be possible.

For example, there may be formed on the surface of a substrate, and an electrode insulated electrically from a silicon substrate can also be used.

Further, a semiconductor substrate made of materials other than silicon, or an insulating substrate, for example, a substrate which consists of glass and plastics, can also be used as a substrate.

Next, a memory element of another embodiment of the present invention is explained.

In this embodiment, the same as aforementioned embodiment, a memory element 10 of a section structure shown in FIG. 1 is constructed.

Then, in this embodiment, an amorphous thin-film 4 is composed of an oxide of transition-metal, the oxide of at least one element selected from titan, vanadium, iron, cobalt, yttrium, zirconium, niob, molybdenum, hafnium, tantalum and tungsten which has a high melting point particularly, or germanium and silicon.

Note that, an amorphous thin-film 4 may contain a plurality of elements in the above-mentioned transition metals and germanium and silicon, or may contain elements other than those.

In the case where a tungsten oxide coating is used for an amorphous thin-film 4 for example, the coating thickness should be set in the range of 5 nm to 50 nm for example, and in the case where a germanium oxide coating is used, the coating thickness should be set in the range of 3 nm to 40 nm, for example.

An upper electrode 5 contains Ag or Cu to be composed.

The upper electrode 5 can be constructed using a coating of the composition that for example Ag or Cu was added to the composition of an amorphous thin-film 4, an Ag coating, an Ag alloy coating, a Cu coating, a Cu alloy coating, and others.

In the case where a silver oxide coating is used for the amorphous thin-film 4 for example, a coating thickness should be set in the range of 10 nm to 30 nm, for example, and in the case where Ag is used, a coating thickness should be set in the range of 3 nm to 20 nm for example.

An electrode layer 6 connected on the upper electrode 5 uses the material which does not contain Ag or Cu that is contained in the upper electrode 5.

Further, the material which contains Ag or Cu can also be used for an electrode layer as a lower electrode 2 similarly to the upper electrode.

The explanation for the other compositions is omitted because it is the same as the memory element of the aforementioned embodiment and the redundant explanation will be omitted.

A memory element 10 of this embodiment is made to operate as follows, and the information can be memorized.

First, a positive potential (+ potential) is applied to the upper electrode 5 which contains Ag or Cu, and a positive voltage is applied to the memory element 10 so that the side of the upper electrode 5 becomes positive. With this, Ag or Cu becomes ionized from the upper electrode 5, and diffuses into the amorphous thin-film 4 and is combined with the electron on the side of a lower electrode 2 to be separated out.

Then, the current pass which contains a large quantity of Ag or Cu is formed inside the amorphous thin-film 4, and the resistance of the amorphous thin-film 4 becomes low. Because the resistance of each layer other than the amorphous thin-film 4 is low from the first, the whole resistance of the memory element 10 can be made low by making the resistance of the amorphous thin-film 4 low.

Subsequently, when the positive voltage is removed and a voltage which a memory element 10 takes is prevented, the memory element 10 is held in the state that the resistance became low. Accordingly, information can be recorded.

On the other hand, when the recorded information is erased, a negative potential (− potential) is applied to the upper electrode 5 which contains Ag or Cu and a negative voltage is applied to the memory element 10 so that the side of the upper electrode 5 becomes negative. By this, Ag or Cu which composes a current pass formed inside the amorphous thin-film 4 becomes an ion and moves inside the amorphous thin-film 4 to return to the initial state on the side of the upper electrode 5.

Then, a current pass by Ag or Cu disappears inside the amorphous thin-film 4, and the resistance thereof becomes high. Because the resistance of each layer other than the amorphous thin-film 4 is low from the first, the whole resistance of the memory element 10 can be made high by making the resistance of the amorphous thin-film 4 high.

Subsequently, when the negative voltage is removed and a voltage which a memory element 10 takes is prevented, the state that the resistance became high is maintained. By this, it becomes possible to erase the recorded information.

By repeating such process, recording (writing) of information and erasing of the recoded information can be performed on the memory element 10 repeatedly.

Then, for example when the state whose resistance is high corresponds to the information "0" and the state whose resistance is low corresponds to the information "1" respectively, it is changed from "0" to "1" in the recording process of information by applying a positive voltage, and it can be changed from "1" to "0" in the erasing process of the information by applying a negative voltage.

Note that, in the above-mentioned recording process and erasing process of information, an amorphous thin-film stays the amorphous (non-crystal) state and it never becomes phase changed to be crystalline.

In other words, recording and erasing of information is made to be performed on the voltage condition that a phase change is never caused in an amorphous thin-film 4.

Further, an amorphous thin-film 4 must be a material which has a high resistance in the initial state before recording and in the state after erasing, as is explained in the above.

The resistance value after recording depends on the recording conditions such as the recording pulse width and the electric current at the time of recording than a cell size of a memory element and a material composition of an amorphous tin-film 4, and when an initial resistance is 100 kΩ or more, the resistance alter recording almost becomes the range of 50Ω to 50Ω.

For reproducing the recoded data, it is sufficient that a ratio of an initial resistance value to a resistance value after the recording is approximately twice or more, so that it is sufficient when a resistance value before recording is 100Ω and a resistance value after the recording is 50Ω or when a resistance value before recording is 100Ω and a resistance value after the recording is 50 kΩ and an initial resistance value of an amorphous thin-film 4 is set to satisfy such conditions.

The setting of the resistance can be adjusted with the oxygen concentration, coating thickness and an area of memory element for example and further with the addition of an impurity material.

According to the memory element 10 of the above-mentioned embodiment, since an amorphous thin-film 4 contains the above-mentioned oxide (particularly an oxide of transition-metal, an oxide of germanium and an oxide of silicon are desirable), information can be memorized by making Ag or Cu diffuse and move into the amorphous thin-film 4 as an ion from the upper electrode 5.

Then, because information recording is performed using a change of the resistance of the memory element 10, when the memory element 10 is made minute, recording of information and the preservation of recorded information can be performed with ease.

Further, according to the memory element 10 of the above-mentioned embodiment, each of the lower electrode 2, amorphous thin-film 4, upper electrode 5, electrode layer 6 and conductive layer 7 can be composed of the material that sputtering is possible to be performed. The sputtering using the target which consists of the composition suitable for the material of each layer may be performed.

Further, the coating can be formed continuously by exchanging a target in the same sputtering device.

Furthermore, a method which uses a sputtering target of an oxide and a method which uses a metal target and introduce oxygen and an inert gas such as argon as an introduction gas in the time of sputtering, so-called a method of the reactive-sputtering and others can be used to form the coating of sputtering of an oxide. Moreover, the coating can be formed by such methods as a CVD method or a deposition method other than sputtering methods.

Also, a memory element 10 of the above-mentioned embodiment can be manufactured as follows, for example.

First, a lower electrode 2, for example, a TiW coating is accumulated on a substrate 1 that has a high electric conductivity, for example, on a silicon substrate where the P-type impurity of the high concentration doped.

Next, an insulating film 3 is formed to cover the lower electrode 2, after that, an opening is formed in the insulating film 3 above the lower electrode 2.

Then, the oxidized surface on the surface of the lower electrode 2 is etched, and a thin oxide coating is removed, and an electrically excellent surface is obtained.

Subsequently, an amorphous thin-film 4, for example a tungsten oxide coating is made by a magnetron sputtering device, for example.

Next, an upper electrode 5, for example, a tungsten oxide coating which contains Ag or an Ag coating is made by the magnetron sputtering device, for example.

Then, an electrode layer 6, for example a TiW coating is made, and further a conductive layer 7, for example an AlSi coating or a Cu coating, is made by the magnetron sputtering device, for example.

Subsequently, patterning is performed with respect to those amorphous thin-film 4, upper electrode 5, electrode layer 6 and conductive layer 7 by plasma etching and others, for example. Also the patterning can be performed by such etching method as ion milling and RIE (the reactive ion etching) and others other than the plasma etching.

As described above, the memory element 10 shown in FIG. 1 can be manufactured.

Note that, in the memory element 10 of the above-mentioned embodiment, though Ag or Cu is contained in the upper electrode 5 and is not contained in the lower electrode, the construction in which Ag or Cu is contained only in the lower electrode and the construction in which Ag or Cu is contained in both the lower electrode and upper electrode can be employed.

A storage device (a memory device) can be constructed by arranging matrices-shaped the memory element 10 of the above-mentioned embodiment in large numbers.

A wiring connected to the side of the lower electrode 2 and a wiring connected to the side of the upper electrode 5 is provided for each memory element 10, and each memory element 10 is arranged around the crossing of those wirings, for example.

Then, specifically, the lower electrode 2 is, for example, formed in common for the memory cells in the column direction; the wiring connected to the conductive layer 7 is formed in common for the memory cells in the row direction; a memory cell to be recorded is selected by selecting the lower electrode 2 and the wiring, to which a potential is applied; and recording of information and erasing of the recoded information can be performed by the electric current flowing into a memory element 10 of this memory cell.

Recording information and reading of the recorded information can easily be performed with respect to the memory element 10 of the above-mentioned embodiment, and particularly the memory element has an excellent characteristic under the high temperature environment and in the stability of long-term data preservation.

Further, with respect to the memory element 10 of the above-mentioned embodiment, the integration (toward high density) of the storage device and miniaturization can be obtained, because recording information and the preservation of the recorded information becomes easy when the memory element is miniaturized.

Practice Example

Next, the memory element 10 of the above-mentioned embodiment was actually made, and a characteristic was studied.

<Experiment 9>

First, a TiW coating of 100 nm in coating thickness was accumulated by sputtering as a lower electrode 2 on a substrate 1 whose electric conductivity was high, for example on a silicone substrate where the p-type impurity of a high concentration was doped.

Next, the lower electrode 2 was covered, and a photo-resist was formed, and after that, by photo-lithography, exposure and development were performed and an opening (through-hole) was formed in the photo-resist on the lower electrode 2. The size of opening (through-hole) was 2 µm by 2 µm.

Subsequently, annealing at 270 degree centigrade in the vacuum state was performed, and a photo-resist was made to change, and an insulating film 3 was formed as a stable hard-cure resist against the temperature, the etching and others. Note that, the hard-cure resist was used for an insulating film 3, because the resist could be formed with ease for an experiment, so that it is considered that there may be a case in which the other material (silicon oxide coating and others) is used for an insulating film 3 when manufacturing the product.

Then, a tungsten oxide coating of 20 nm in coating thickness was formed as an amorphous thin-film 4 by a reactive-sputtering method with the introduction of an oxygen gas using a magnetron sputtering device. The composition of this tungsten coating was $W_xO_{100-x}$, (x and numbers added are the percentage of atomic volume), and x was approximately 24.

Further, a tungsten oxide coating of 20 nm in coating thickness was formed as an upper electrode 5 by the same magnetron sputtering device with keeping the same vacuum state. The concentration of Ag of this tungsten oxide coating was approximately 50 percentages.

Furthermore, a TiW coating of 100 nm in coating thickness was formed as an electrode layer 6 by the same magnetron sputtering device with keeping the same vacuum state and then an AlSi coating of 100 nm in coating thickness was formed as a conductive layer 7. The compositions of the TiW coating and AlSi coating were $Ti_{50}W_{50}$ and $Al_{97}Si_3$ (numbers added are the percentage of atomic volume) respectively.

Subsequently, patterning with the size of 50 µm×50 µm was performed with respect to each layer of the amorphous thin-film 4, upper electrode 5, electrode layer 6 and conductive layer 7 which was accumulated on the insulating film 3 which was made by the hard-cure resist, by photo-lithography using a plasma etching device.

As described above, the memory element 10 of the structure shown in FIG. 1 was made, to be a sample 20 of the memory element 10.

With respect to this sample 20 of the memory element 10, a positive potential (+ potential) was applied to the conductive layer 7 on the side of the upper electrode 5, and an earth potential (a ground potential) was connected to the rear side of the substrate 1.

Then, a positive potential which was applied to a conductive layer 7 was increased from 0V, and a change of the electric current was measured. However, the current limiter was set to work when the electric current reached 0.5 mA, so that it was set that a positive potential applied to a conductive layer 7, namely a voltage applied to an element 10 could not increase further more.

Further, the electric current reached 0.5 mA, a positive potential applied to a conductive layer 7 was made to decrease to 0V from the state in which the current limiter worked, and a change of the electric current was measured.

Figure 12:
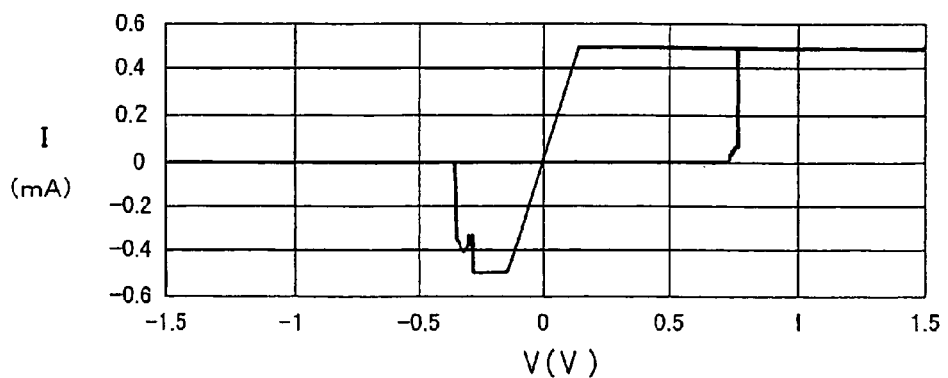
FIG. 12 is a diagram that shows a result of measurement of the I-V characteristic of the sample of the memory element of FIG. 1.

A graph of the obtained I-V characteristic is shown in FIG. 12A.

In FIG. 12A, it is understood that the resistance is high in the initial state and the memory element 10 is in the off-state, and the electric current increases rapidly with the voltage increasing over the threshold voltage Vth, in other words the resistance becomes low to transit to the on-state. Accordingly, it is understood that the information is recorded.

On the other hand, after that, by decreasing the voltage, also the electric current decreases, though the amount of the decrease of the electric current is larger and the resistance rises little by little, finally the resistance value becomes lower enough than the initial resistance value, and the on-state is kept and it is understood that the recorded information is preserved.

The resistance value at the voltage V=0.1V was approximately 500 KΩ under the off-state and approximately 500Ω under the on-state in the case of this sample 20.

Further, as shown in the diagram, the voltage V of the reverse polarity, namely a negative potential (− potential) is applied to the conductive layer 7 on the side of an upper electrode 5, and the rear side of the substrate 1 is connected to the earth potential (the ground potential), and a negative potential of V=−0.4V or less is applied to the conductive layer 7; after that, when setting the potential of conductive layer 7 to 0V, it was confirmed that the resistance returns to the high resistance of initial state in OFF-state. In other words, it is understood that the information recorded in the memory element 10 can be erased by applying a negative voltage.

<Experiment 10>

The characteristic was studied in the case where an amorphous thin-film 4 was composed of a germanium oxide.

First, the same as a tungsten oxide coating, $Ge_xO_{100-x}$ was formed by a reactive-sputtering method as an amorphous thin-film 4. Hereupon, a coating thickness of a germanium oxide was 5 nm and Ag of 6 nm was accumulated on that coating and an upper electrode is formed. Others were the same as a sample 20 and a memory element was made.

By means of the above-mentioned method, an amount of the introduction of oxygen gas in the reactive-sputtering was changed, and three samples of 21 to 23 were made.

The germanium and oxygen concentration which were obtained are as follows.

[The Concentration (Percentages of Atomic Volume)]

| Sample No. | Ge | O |
|---|---|---|
| Sample 21 | 50.5 | 49.5 |
| Sample 22 | 44.1 | 58.9 |
| Sample 23 | 32.7 | 67.3 |

The I-V characteristic of each memory element of those samples 21 to 23 was measured. A result of measurement of the sample 21 is shown in FIG. 13A, and a result of measurement of the sample 22 is shown in FIG. 13B, and a result of measurement of the sample 23 is shown in FIG. 13C.

Figure 13A:
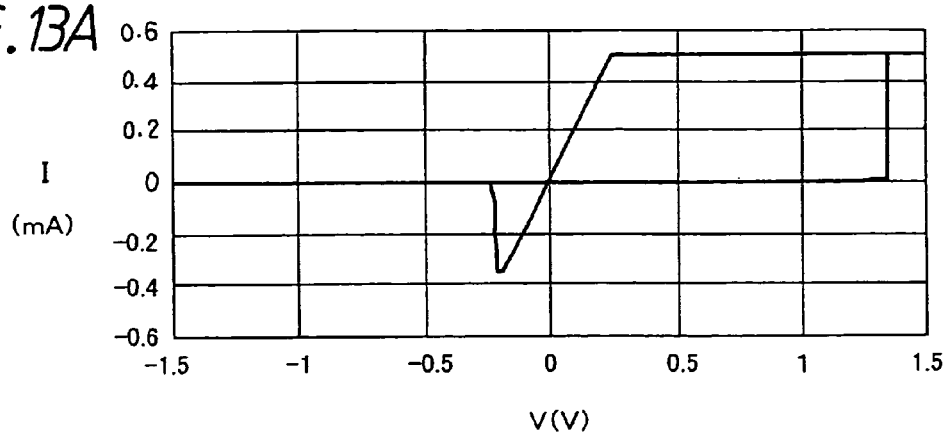
FIGS. 13A to 13C are diagrams that show a result of measurement of the I-V characteristics of a sample in which a germanium oxide was used for an amorphous thin-film.
Figure 13B:
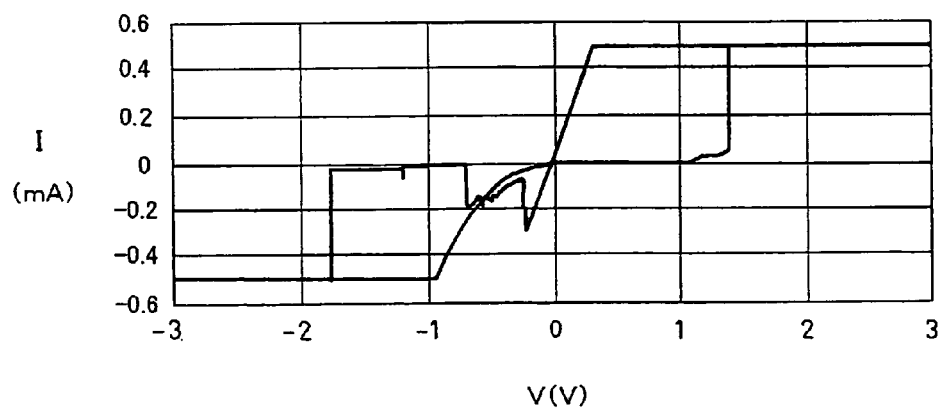
Figure 13C:
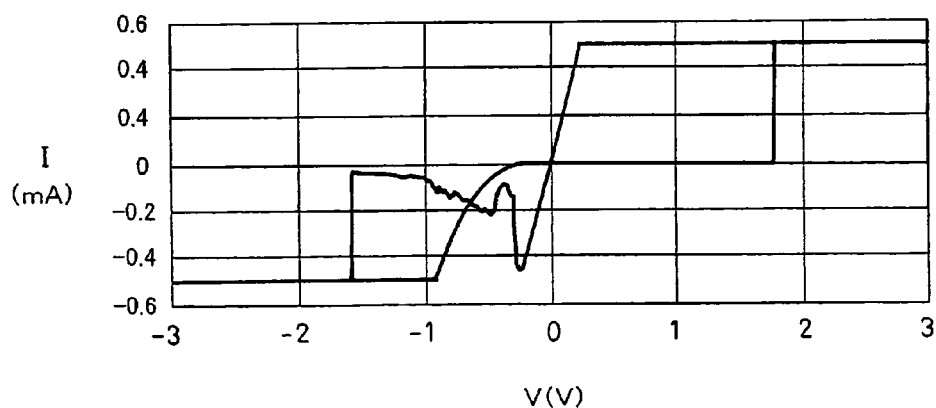

As shown in FIGS. 13A to 13C, an initial resistance was 300 kΩ in the sample 21, and that was 500 kΩ in the sample 22, and that was 500 kΩ in the sample 23, and all were high.

Then, when a voltage was enlarged in the positive direction, the electric current began to flow rapidly at a certain threshold voltage Vth, and it reached promptly to the limiter setup value 0.5 mA of electric current.

Subsequently, when a voltage is made to decrease to around 0V, it is understood that the resistance lowers in comparison with an initial resistance value.

Further, all samples has approximately 500Ω resistance, and it is understood that resistance value decreases by approximately three digits in recording.

On the other hand, when a voltage is lowered in the negative direction, the amount of electric current of each sample decreases at approximately −0.2V, and the resistance value changes.

When a voltage is further lowered, there are a sample (sample 21) that maintains the state in which the electric current does not flow and samples (samples 22 and 23) that the amounts of electric current increase rapidly at a certain threshold voltage or less to reach the limiter limit of −0.5 mA; however, when a voltage is returned to 0 again, each sample transits from this state to the high resistance state.

Then, the sample 21 is returned to the initial resistance value before the recording, and the samples 22 and 23 become approximately 10 kΩ.

However, when a maximum value of the voltage in the negative direction is controlled to be a threshold voltage or less, the samples 22 and 23 are returned to the initial resistance value before the recording as well as the sample 21.

As described above, by applying the voltage with reverse polarity, the resistance value is returned to the state before the recording, in other words, the erasing operation can be performed.

<Experiment 11>

The characteristic in the case where an amorphous thin-film 4 was composed of a silicon oxide was studied.

First, as in the cases of a tungsten oxide coating and a germanium oxide coating, $Si_xO_{100-x}$ was formed by a reactive-sputtering method as an amorphous thin-film 4.

The composition x of the silicon was approximately equal to the composition of $SiO_2$, and it was x=33.

Then, a sample (sample 24) of silicon oxide coating of 3 nm in coating thickness and a sample (sample 25) of silicon oxide coating of 6 nm in coating thickness were formed.

Next, with respect to each sample, a thin-film in the thickness of 6 nm of the compound of $SiO_2$ and Ag was accumulated on the oxide silicon coating and an upper electrode was formed. In addition, the compound of this $SiO_2$ and Ag was the composition in which Ag and $SiO_2$ were contained at approximately the same rate.

Others were the same as the sample 20, and a memory element was made.

The I-V characteristic of each memory element of two kinds of sample (sample 24 and sample 25) having a different coating thickness of the oxide silicon was measured. A result of measurement of a sample 24 is shown in FIG. 14A, and a result of measurement of a sample 25 is shown in FIG. 14B.

Figure 14A:
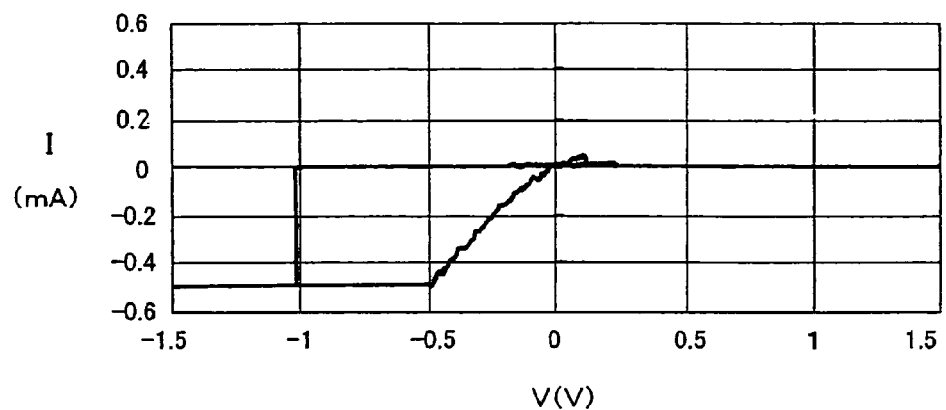
FIGS. 14A and 14 B are diagrams that show a result of measurement of the I-V characteristic of a sample in which a silicon oxide is used for an amorphous thin-film.
Figure 14B:
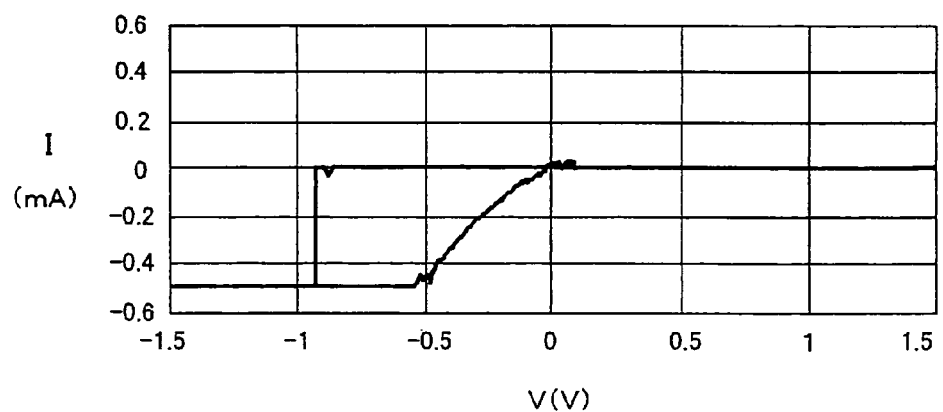

In FIGS. 14A and 14B, both the resistance are high with 1 MΩ or more in the initial state, and when a voltage is enlarged in the negative direction, the electric current began to flow rapidly at a certain threshold voltage Vth, and reaches promptly to the limiter setup value 0.5 mA of the electric current.

Subsequently, when a voltage is made to decrease to around 0V, the resistance lowers in comparison with the initial resistance value and becomes approximately 1 kΩ.

In other words, it is understood that the resistance value decreases approximately three digits by the recording.

When a voltage is further increased in the positive direction, the amount of electric current of each sample decreases, and again resistance value is changed to be the high state.

As described above, by applying the voltage of the reverse polarity to the recording, the resistance value is returned to the state before recording, in other words, the erasing operation can be performed.

Note that, in the memory element 10 of the above-mentioned embodiment, a silicon substrate of the high impurity concentration that the conductivity is high was used for the substrate 1 and the earth potential (the ground potential) is applied to the rear side of substrate 1; however, other compositions for applying a voltage on the side of a lower electrode can also be employed.

For example, an electrode formed on the surface of a substrate and insulated electrically from the silicon substrate can also be used.

Further, a semiconductor substrate other than the silicon substrate, or an insulating substrate, for example, a substrate formed of glass or resin can also be used as a substrate.

Further, the melting point of a tungsten oxide coating which is an oxide used in the above-mentioned experiment is at 1400 degree centigrade or more (a value written in literature under the crystal state, the same as following), the melting point of a germanium oxide coating is 1000 degree centigrade or more, and the melting point of a silicon oxide coating is 1700 degree centigrade or more, so that those are the thermally stable materials and the crystallization temperature is high.

Furthermore, the mechanism of the recording is the ion conduction by applying the electric field of Ag or Cu, so that in the case where an oxide of transition metal other than tungsten used in the above-mentioned experiments is used, it is possible that a memory operation can be performed similarly to tungsten as long as the oxide of transition metal has the outer electron structure similar to the electron structure of tungsten.

Among the transition metals, an oxide of titan, vanadium, iron, cobalt, yttrium, zirconium, niob, molybdenum, hafnium, and tantalum is suitable from the viewpoint of the melting point of the oxide being high, and an oxide thin-film being made easily.

Using the memory element of the present invention, a storage device (a memory device) can be constructed by arranging a memory element in large numbers, for example, column-shaped or the matrices-shaped.

Further, a MOS transistor or a diode for the selection of an element is connected to each memory element if necessary, and a memory cell is constructed.

Furthermore, through wiring the memory element is connected to a sense amplifier, an address recorder, a recording, erasing and reading-out circuit, and others.

The memory element of the present invention can be applied to various memory devices. The memory element can be applied to each of memory forms, for example, so-called PROM (programmable ROM) to which writing can be performed only once, EEPROM (Electrically Erasable ROM) in which electrically erasing can be performed, or so-called RAM (Random Access Memory) in which high speed recording, erasing and reproducing can be performed, and others.

The present invention is not limited to the above described embodiments and various other constructions can be obtained within the gist of the present invention.

The invention claimed is:

1. A storage device, comprising:
   a plurality of memory elements, each memory element including (a) a silicon substrate portion with an impurity imparting electric conductivity to the silicon substrate portion, (b) a first electrode portion on said silicon substrate portion, (c) an electrically insulating layer on said first electrode portion, (d) an opening in said electrically insulating layer exposing at least a section of said first electrode portion, (e) a thin-film on said electrically insulating layer and in contact with said first electrode portion within a perimeter of said opening, (f) a second electrode on said thin-film within said perimeter of said opening, said second electrode containing germanium (Ge), antimony (Sb), tellurium (Te), and copper (Cu), (g) an electrode layer on the second electrode within said perimeter of said opening, and (h) a conductive layer on said electrode layer and in electrical communication with said second electrode, said conductive layer being unique to that memory element and being shorter parallel to a surface of said silicon substrate portion than said first electrode portion,
   wherein,
   said first electrode is common to two or more memory elements,
   said first electrode does not contain Cu in a memory state,
   for each memory element, said thin-film is a non-phase changing, amorphous material comprising Ge, Sb, and Te,
   for each memory element, said amorphous material of said thin film has a first surface in contact with said first electrode portion and a second surface in contact with the second electrode,
   for each memory element, said electrode layer comprises a material excluding Cu and including a Ti/TiW multi-layer or a W/TiW multi-layer, said electrode layer being between and in contact with said conductive layer and said second electrode, and
   for each memory element, when a positive voltage is applied to said first electrode portion or said second electrode, ions of Cu diffuse into the thin-film resulting in a reduction of electrical resistance of the thin-film, said reduction being persistent until an application of a negative voltage.

2. A memory element comprising:
   a silicon substrate with an impurity imparting electric conductivity to the silicon substrate;
   a first electrode on said silicon substrate;

an electrically insulating layer on said first electrode;
an opening in said electrically insulating layer exposing at least a portion of said first electrode;
a thin-film on said electrically insulating layer and in contact with said first electrode within a perimeter of said opening;
a second electrode on said thin-film within said perimeter of said opening, said second electrode containing germanium (Ge), antimony (Sb), tellurium (Te), and copper (Cu);
an electrode layer on the second electrode within said perimeter of said opening; and
a conductive layer on said electrode layer and in electrical communication with said second electrode, said conductive layer being unique to the memory element and being shorter parallel to a surface of said silicon substrate than said first electrode, wherein,
said first electrode does not contain Cu in a memory state,
said thin-film is a non-phase changing, amorphous material comprising Ge, Sb, and Te,
said amorphous material of said thin film has a first surface in contact with said first electrode and a second surface in contact with the second electrode,
said electrode layer comprises a material excluding Cu and including a Ti/TiW multi-layer or a W/TiW multi-layer, said electrode layer being between and in contact with said conductive layer and said second electrode, and when a positive voltage is applied to said first electrode or said second electrode, ions of Cu from said first electrode or said second electrode diffuse into the thin-film resulting in a reduction of electrical resistance of the thin-film, said reduction being persistent until an application of a negative voltage.

3. The memory element according to claim 2, wherein said electrode layer includes an element whose valence is larger than that of the copper (Cu) contained in said second electrode when ionized.

4. The memory element of claim 2, wherein said thin-film contains silicon (Si) as an impurity therein.

5. The memory element of claim 4, wherein said thin-film contains silicon as the impurity in an amount of 15 to 23 percentage of atomic volume.

6. The memory element of claim 4, wherein a thickness of said thin-film is in a range of 10 nm-51 nm, inclusive.

7. The memory element of claim 4, wherein said thin-film is composed of $(Ge_{22}Sb_{22}Te_{56})_z Si_{100-z}$, where 'z' and '100-z' are each representative of a percentage of atomic volume.

8. The memory element of claim 7, wherein said thin-film contains silicon as the impurity in an amount of 15 to 23 percentage of atomic volume.

9. The memory element of claim 8, wherein a thickness of said thin-film is in a range that is inclusive of 10 nm to 51 nm, inclusive.

* * * * *